(12) United States Patent
Wong et al.

(10) Patent No.: US 12,414,363 B2
(45) Date of Patent: Sep. 9, 2025

(54) SEMICONDUCTOR DEVICE AND MANUFACTURING METHODS THEREOF

(71) Applicant: Taiwan Semiconductor Manufacturing Company, Ltd., Hsinchu (TW)

(72) Inventors: Sheng-Syun Wong, Hsinchu (TW); Shahaji B. More, Hsinchu (TW); Chih-Yu Ma, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 691 days.

(21) Appl. No.: 17/655,712

(22) Filed: Mar. 21, 2022

(65) Prior Publication Data

US 2023/0299082 A1    Sep. 21, 2023

(51) Int. Cl.
| | | |
|---|---|---|
| *H10D 84/83* | (2025.01) | |
| *H01L 21/762* | (2006.01) | |
| *H10B 10/00* | (2023.01) | |
| *H10D 30/01* | (2025.01) | |
| *H10D 30/62* | (2025.01) | |

(52) U.S. Cl.
CPC ..... *H10D 84/834* (2025.01); *H01L 21/76224* (2013.01); *H10B 10/12* (2023.02); *H10D 30/024* (2025.01); *H10D 30/62* (2025.01)

(58) Field of Classification Search
CPC .... H10D 84/834; H10D 30/024; H10D 30/62; H10D 84/0107; H10D 64/112; H10D 64/117; H10D 30/0221; H10D 62/021; H10D 84/0149; H10D 62/115; H10D 62/113; H10D 84/0188; H10D 84/013; H10D 84/038; H10D 84/017; H10D 30/6219; H01L 21/76224; H01L 21/76831; H01L 23/528; H10B 10/12; A23B 2/783; H10F 30/2863; H10F 77/1462; H10F 99/00; B82Y 10/00; B82Y 40/00; H10H 20/851
See application file for complete search history.

(56) References Cited

U.S. PATENT DOCUMENTS

| | | | |
|---|---|---|---|
| 8,956,942 B2 * | 2/2015 | Loubet | H10D 64/66 438/164 |
| 9,041,094 B2 * | 5/2015 | He | H10D 30/024 257/327 |
| 9,768,272 B2 | 9/2017 | Hashemi et al. | |
| 2010/0163971 A1 * | 7/2010 | Hung | H10D 84/0151 257/327 |
| 2015/0187943 A1 * | 7/2015 | Lee | H01L 21/3065 257/192 |
| 2015/0303118 A1 * | 10/2015 | Wang | H10D 84/0149 257/401 |
| 2017/0092735 A1 * | 3/2017 | Hashemi | H01L 21/30604 |

(Continued)

*Primary Examiner* — Raj R Gupta
(74) *Attorney, Agent, or Firm* — Harrity & Harrity, LLP

(57) ABSTRACT

Some implementations described herein provide techniques and apparatuses for forming insulator layers in or on a semiconductor substrate prior to forming epitaxial layers within source/drain regions of a fin field-effect transistor. The epitaxial layers may be formed over the insulator layers to reduce electron tunneling between the source/drain regions of the fin field-effect transistor. In this way, a likelihood of leakage into the semiconductor substrate and/or between the source/drain regions of the fin field-effect transistor is reduced.

20 Claims, 26 Drawing Sheets

(56) References Cited

U.S. PATENT DOCUMENTS

| | | | |
|---|---|---|---|
| 2017/0162695 A1* | 6/2017 | Ching | H10D 30/024 |
| 2017/0243959 A1* | 8/2017 | Cheng | H01L 21/76264 |
| 2020/0168735 A1* | 5/2020 | Yu | H10D 84/0158 |

* cited by examiner

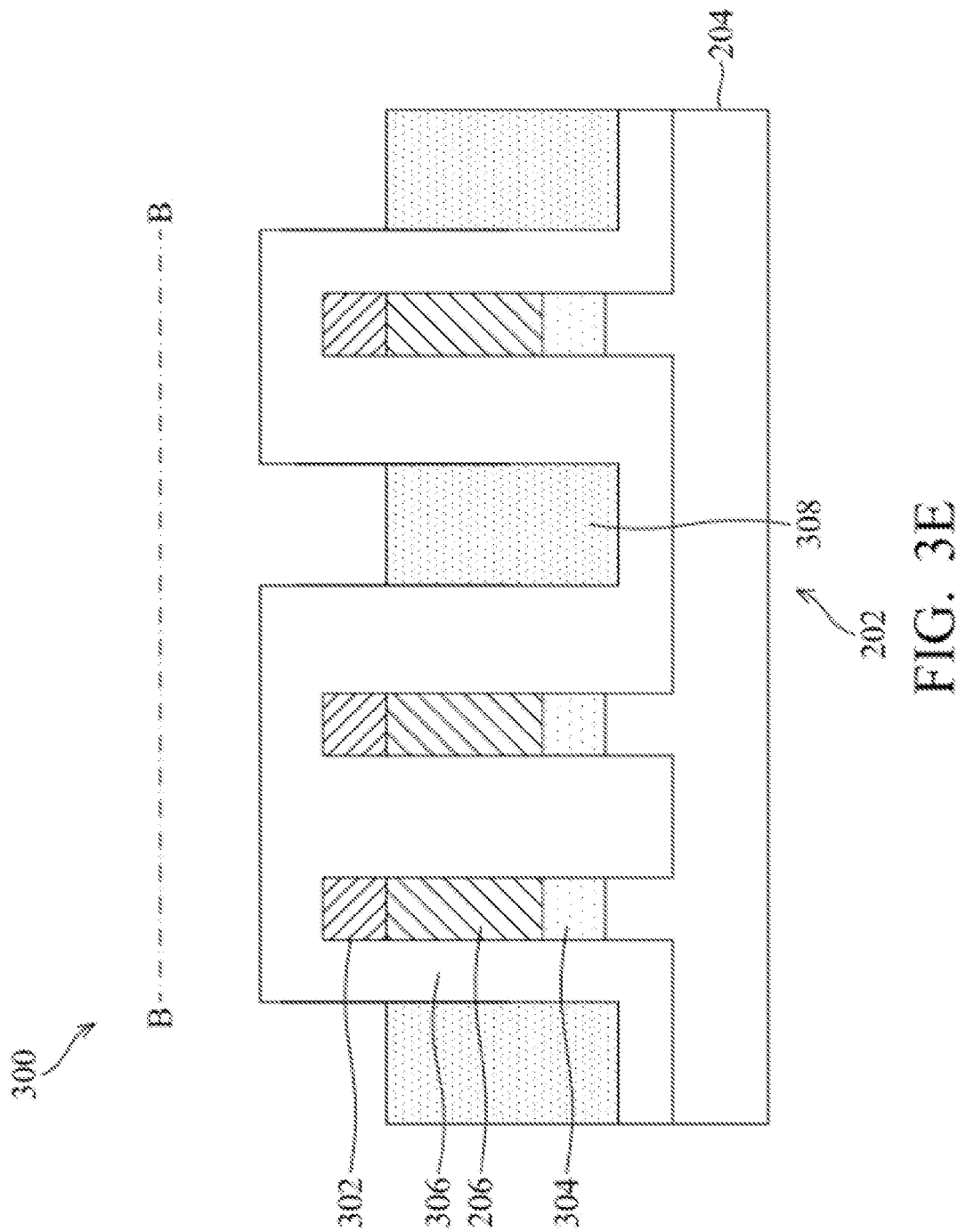

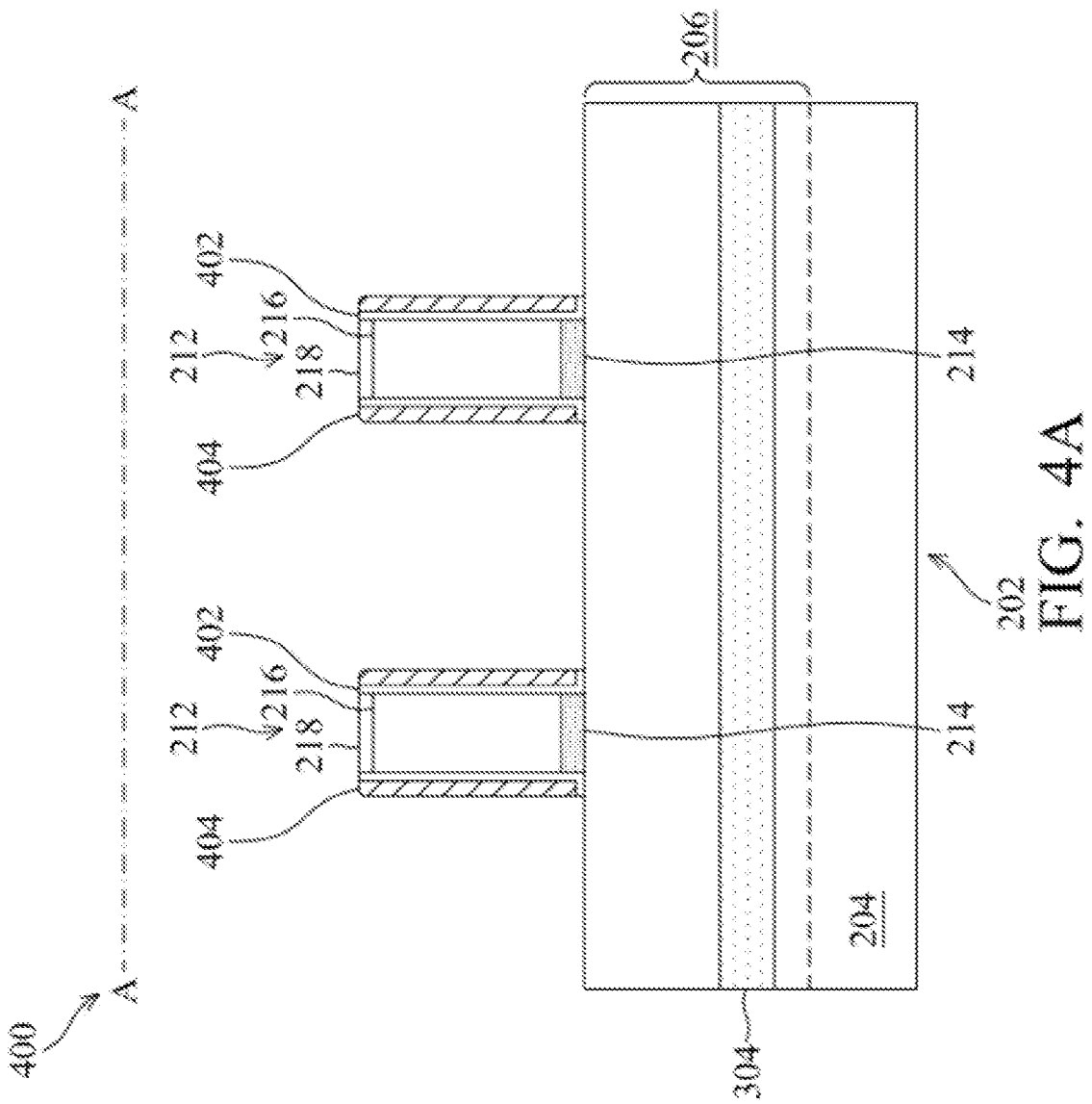

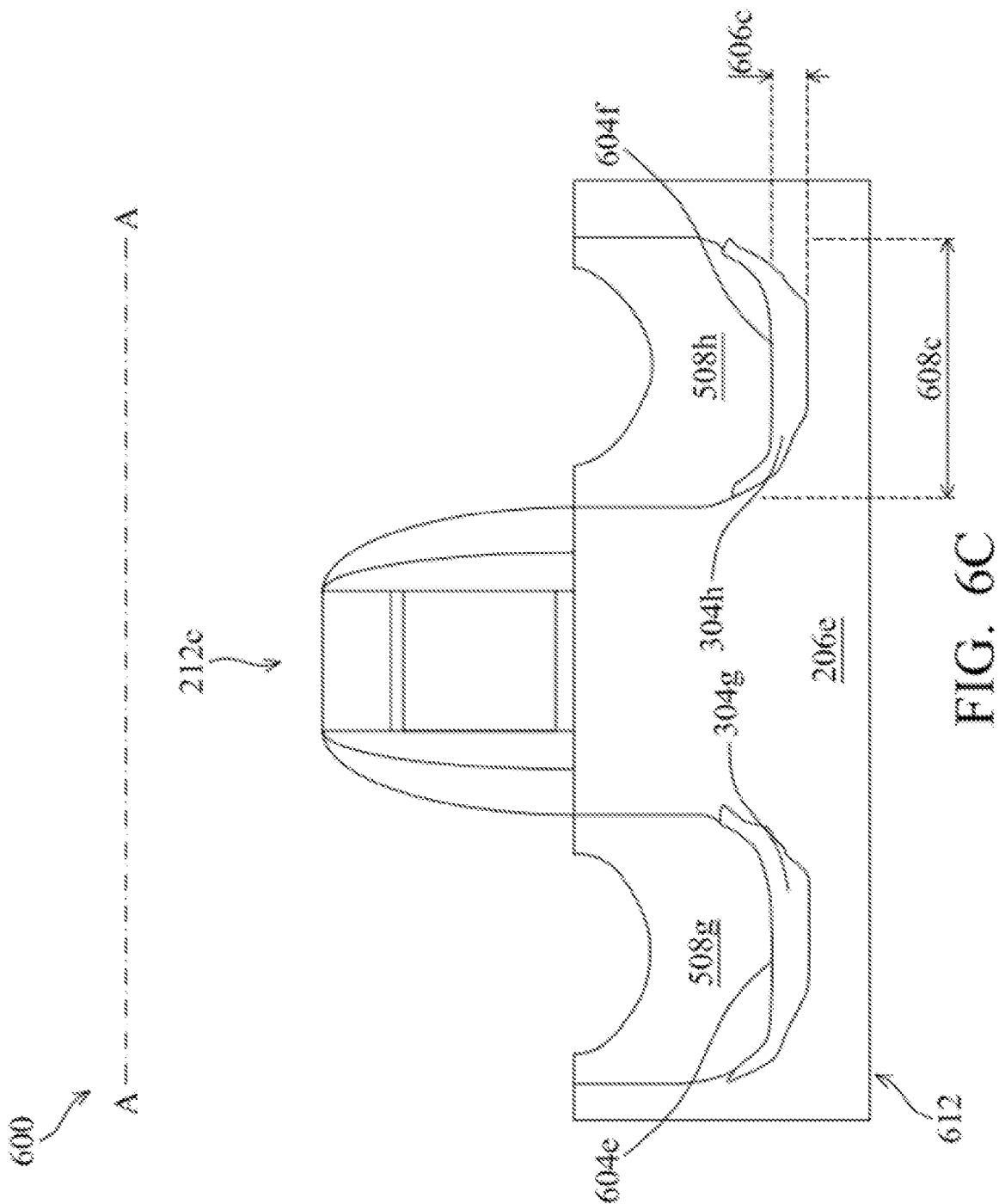

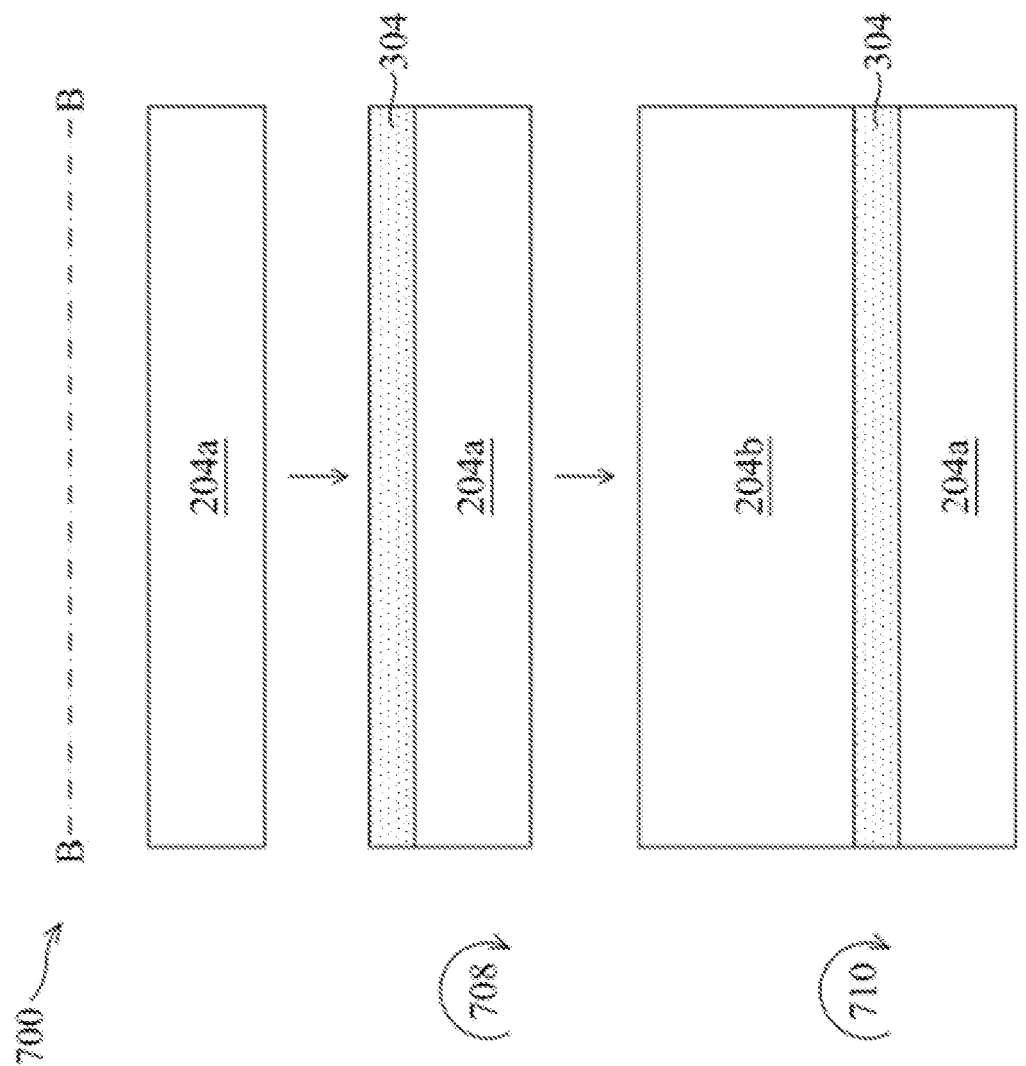

SEMICONDUCTOR DEVICE AND MANUFACTURING METHODS THEREOF

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H, 4A-4D, and 5A-5F are diagrams of an example implementations described herein.

FIGS. 6A-6C are diagrams of example types of devices described herein.

FIGS. 7A-7C are diagrams of example processing operations for forming an insulator layer described herein.

DETAILED DESCRIPTION

Figure 1:
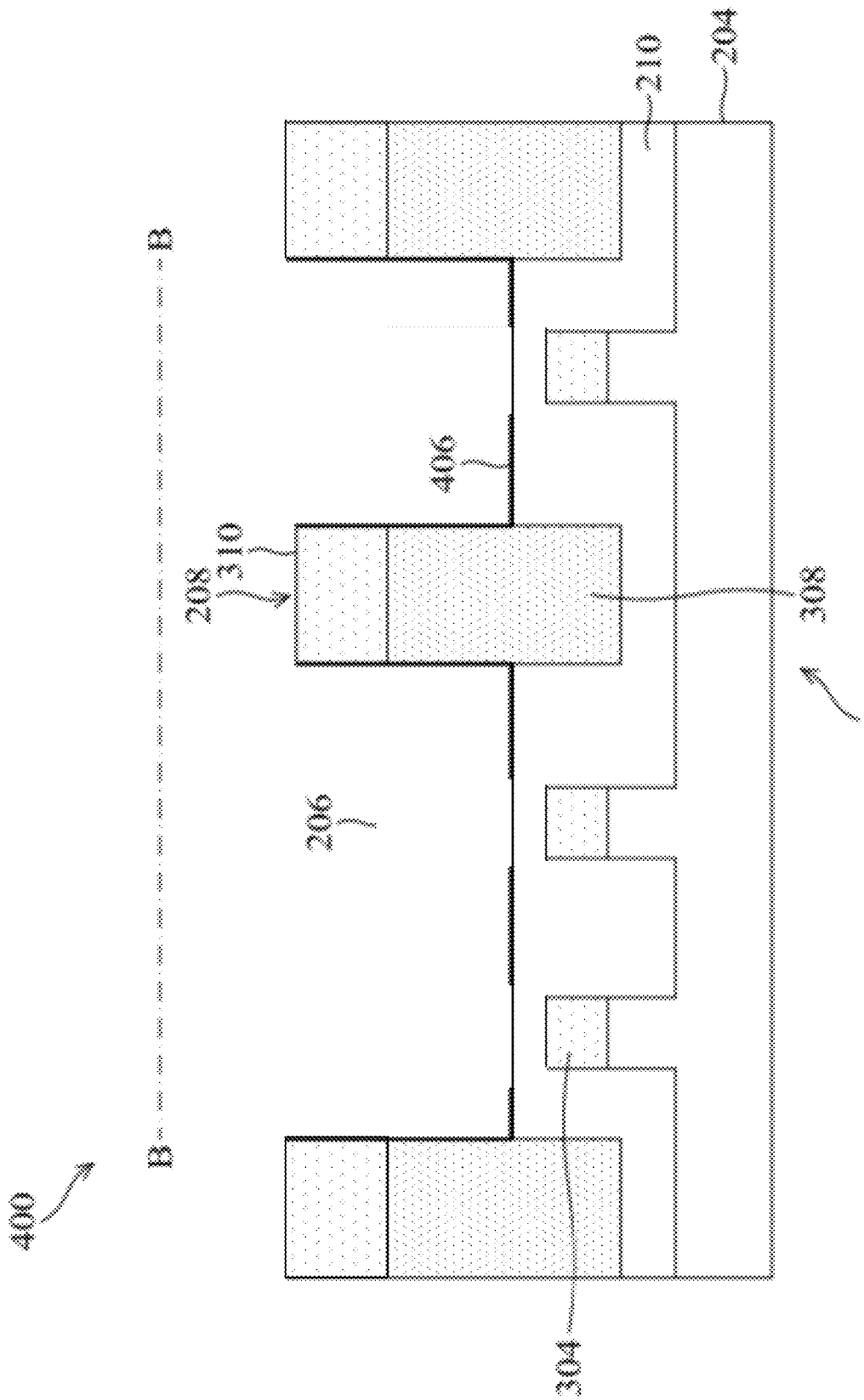
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, reducing geometric and dimensional properties of a fin field-effect transistor (finFET) may decrease a performance of the finFET. As an example, a likelihood of short channel effects, such as drain-induced barrier lowering in a finFET, may increase as finFET technology processing nodes decrease. Additionally or alternatively, a likelihood of electron tunneling and leakage in a finFET may increase as a gate length of the finFET decreases.

Such leakage may occur within the finFET between source/drain regions of the finFET and/or from the source-drain regions into an underlying semiconductor substrate. The leakage may increase power consumption of a semiconductor device including the finFET and also decrease operational performance of a gate structure between the source/drain regions.

Some implementations described herein provide techniques and apparatuses for forming insulator layers in or on a semiconductor substrate prior to forming epitaxial layers within source/drain regions of a finFET. The epitaxial layers may be formed over the insulator layers to reduce electron tunneling between the source/drain regions of the finFET.

In this way, a likelihood of leakage into the semiconductor substrate and/or between the source/drain regions of the finFET is reduced. As a result, performance characteristics relating to power consumption of a semiconductor device including the finFET and operation of a gate structure between the source/drain regions may be increased.

FIG. 1 is a diagram of an example environment 100 in which systems and/or methods described herein may be implemented. As shown in FIG. 1A, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

An ion implantation tool 114 is a semiconductor processing tool that is capable of implanting ions into a substrate such as a semiconductor wafer. For example, the ion implantation tool 114 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 includes a programmed device that is configured to travel a particular path and/or may operate semi-autonomously or autonomously. In some implementations, the semiconductor processing environment 100 includes a plurality of wafer/die transport tools 116.

The wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
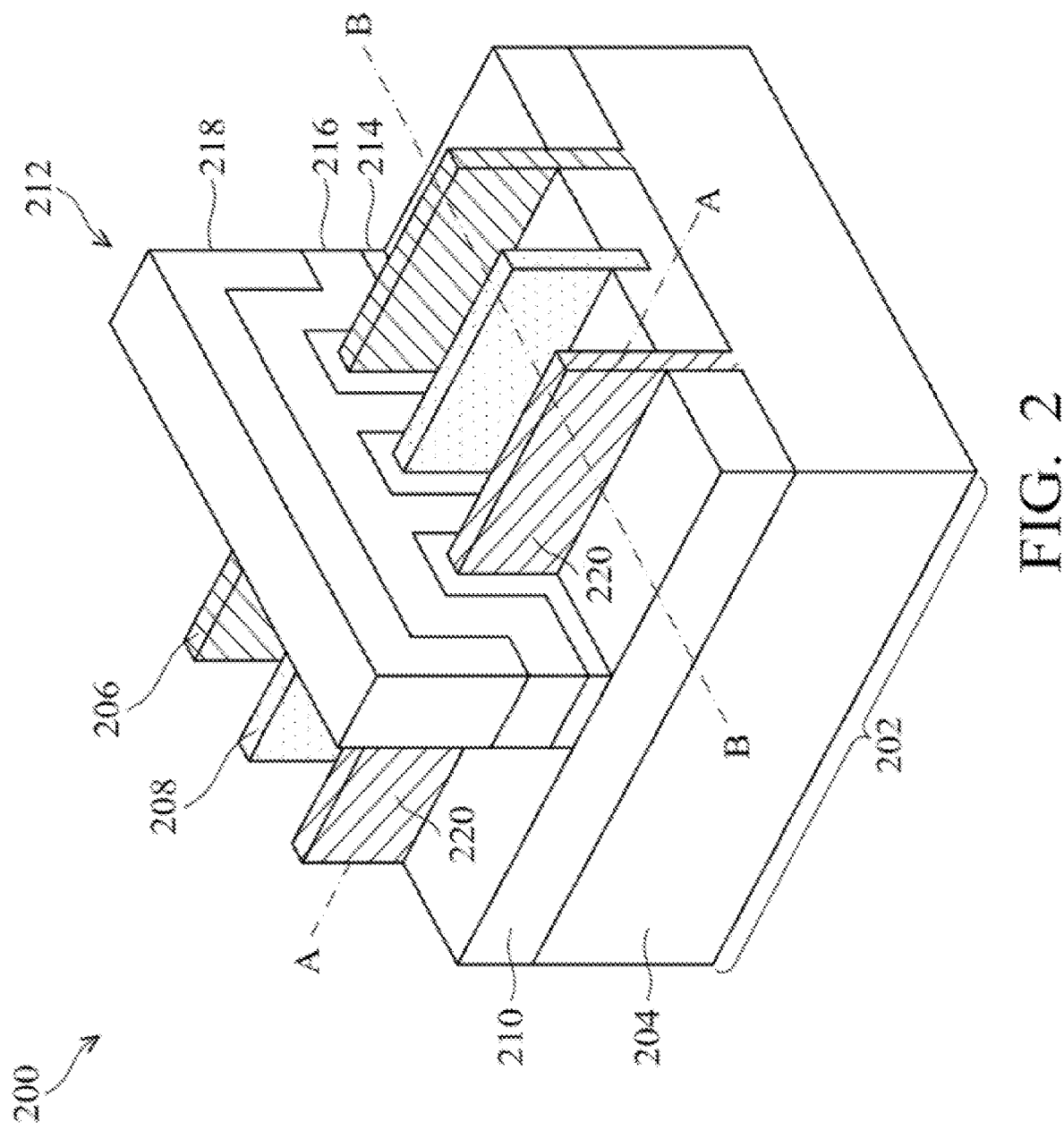
FIG. 2 is a diagram of an example semiconductor structure described herein.

FIG. 2 is a diagram of an example semiconductor device 200 structure described herein. The semiconductor device 200 includes a device region 202. Example types of the semiconductor device 200 include a static random access memory (SRAM) type of semiconductor device, an input/output (IO) type of semiconductor type of device, or a ring oscillator (RO) type of semiconductor device, among other examples.

The device region 202 may include one or more transistors or other devices. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region.

The device region 202 includes a semiconductor substrate 204. The semiconductor substrate 204 includes a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, or another type of semiconductor substrate.

Fin structures 206 are included above (and/or extend above) the semiconductor substrate 204 for the device region 202. A fin structure 206 may provide an active region where one or more devices (e.g., fin-based transistors) are formed, and may therefore be referred to as active fin structures. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the semiconductor substrate 204 away to form recesses in the semiconductor substrate 204. The recesses may then be filled with isolating material that is recessed or etched back.

In some implementations, hybrid fin structures 208 are included between the fin structures 206 in an alternating arrangement. The hybrid fin structures 208 may also be referred to as h-fins, dummy fins, and/or non-active fins, among other examples. A hybrid fin structure 208 includes a fin structure that extends in the first direction approximately parallel to the fin structures 206. In some implementations, a hybrid fin structure 208 is included between two fin structures 206 and extends approximately the same length as the two fin structures 206.

A hybrid fin structure 208 is configured to provide electrical isolation between one or more structures and/or components included in the device region 202. In some implementations, a hybrid fin structure 208 is configured to provide electrical isolation between two or more fin structures 206 (e.g., two or more active fin structures). In some implementations, a hybrid fin structure 208 is configured to provide electrical isolation between two or more source/drain regions in the device region 202. In some implementations, a hybrid fin structure 208 is configured to provide electrical isolation between two or more gates structures or two or more portions of a gate structure. In some implementations, a hybrid fin structure 208 is configured to provide electrical isolation between a source/drain region and a gate structure.

A hybrid fin structure 208 described herein includes a plurality of types of dielectric materials. A hybrid fin structure 208 may include a combination of one or more low dielectric constant (low-k) dielectric materials (e.g., a silicon oxide ($SiO_x$) and/or a silicon nitride ($Si_xN_y$), among other examples) and a one or more high dielectric constant (high-k) dielectric materials (e.g., a hafnium oxide ($HfO_x$) and/or other high-k dielectric material).

Shallow trench isolation (STI) regions 210 are included above the semiconductor substrate 204 and between the fin structures 206 and the hybrid fin structures 208. The STI regions 210 may be formed by etching back an insulating layer formed on the fin structures 206 and on the semiconductor substrate 204. However, other fabrication techniques for the STI regions 210 may be used. The STI regions 210 may electrically isolate adjacent active areas in the fin structures 206 and/or adjacent portions of the fin structures 206 and the hybrid fin structures 208. The STI regions 210 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 210 may include a multi-layer structure, for example, having one or more liner layers.

A dummy gate structure 212 (or a plurality of dummy gate structures 212) is included in the device region 202 over the fin structures 206 (e.g., approximately perpendicular to the fin structures 206). The dummy gate structure 212 engages the fin structures 206 on three or more sides of the fin structures 206. Moreover, the dummy gate structure 212 may be included over the hybrid fin structures 208 and may engage the hybrid fin structures 208 on three or more sides of the hybrid fin structures 208. In the example depicted in FIG. 2, the dummy gate structure 212 includes a gate dielectric layer 214, a gate electrode layer 216, and a hard mask layer 218. In some implementations, the dummy gate structure 212 further includes a capping layer, one or more spacer layers, and/or another suitable layer. The various layers of the dummy gate structure 212 may be formed by suitable deposition techniques and patterned by suitable photolithography and etching techniques.

The term "dummy," as described herein, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. Accordingly, the configuration of the device region 202 illustrated in FIG. 2 may include an intermediate configuration, and additional semiconductor processing operations may be performed for the device region 202 to further process the device region 202.

The gate dielectric layer 214 may include a dielectric oxide layer. The dielectric oxide layer may be formed by chemical oxidation, thermal oxidation, ALD, CVD, and/or other suitable methods. The gate electrode layer 216 may include a poly-silicon material or another suitable material. The gate electrode layer 216 may be formed by suitable deposition processes such as LPCVD or PECVD, among other examples. The hard mask layer 218 may include any material suitable to pattern the gate electrode layer 216 with particular features/dimensions on the semiconductor substrate 204.

In some implementations, the various layers of the dummy gate structure 212 are first deposited as blanket layers. Then, the blanket layers are patterned through a process including photolithography and etching processes, removing portions of the blanket layers and keeping the remaining portions over the STI regions 210, over the fin structures 206, and/or over the hybrid fin structures 208 to form the dummy gate structure 212.

Source/drain areas 220 are disposed in opposing regions of the fin structures 206 (e.g., in opposing regions of the active fin structures) with respect to the dummy gate structure 212. The source/drain areas 220 include areas in the device region 202 in which source/drain regions are to be formed in one or more epitaxial growth operations, and therefore the source/drain regions may be referred to as epitaxial regions. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the source/drain regions by epitaxial growth (e.g., neighboring source/drain regions, as opposed to on opposing sides of the dummy gate structure 212, being coalesced), two functional transistors may be implemented. Coalesced neighboring source/drain regions are referred to herein as merged epitaxial regions and merged source/drain regions. Other configurations in other examples may implement other numbers of functional transistors.

FIG. 2 further illustrates reference cross-sections that are used in later figures, including FIGS. 3A-7C. FIGS. 3A-7C are schematic cross-sectional views of various portions of the device region 202 and/or another device region of the semiconductor device 200 illustrated in FIG. 2, and correspond to various processing stages of forming fin-based transistors in the device region 202 and/or another device region of the semiconductor device 200. Cross-section A-A is in a plane along a channel in a fin structure 206 between opposing source/drain areas 220. Cross-section B-B is in a plane perpendicular to cross-section A-A, and is across a plurality of fin structures 206 and across a plurality of hybrid fin structures 208 in a plurality of source/drain areas 220. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

FIGS. 3A-3H are diagrams of an example implementation 300 described herein. The example implementation 300 includes an example of forming the fin structures 206 and forming the hybrid fin structures 208 for transistors in the device region 202 (and/or another device region) of the semiconductor device 200. FIGS. 3A-3H are illustrated from the perspective of the cross-sectional plane B-B in FIG. 2 for the device region 202.

Figure 3A:
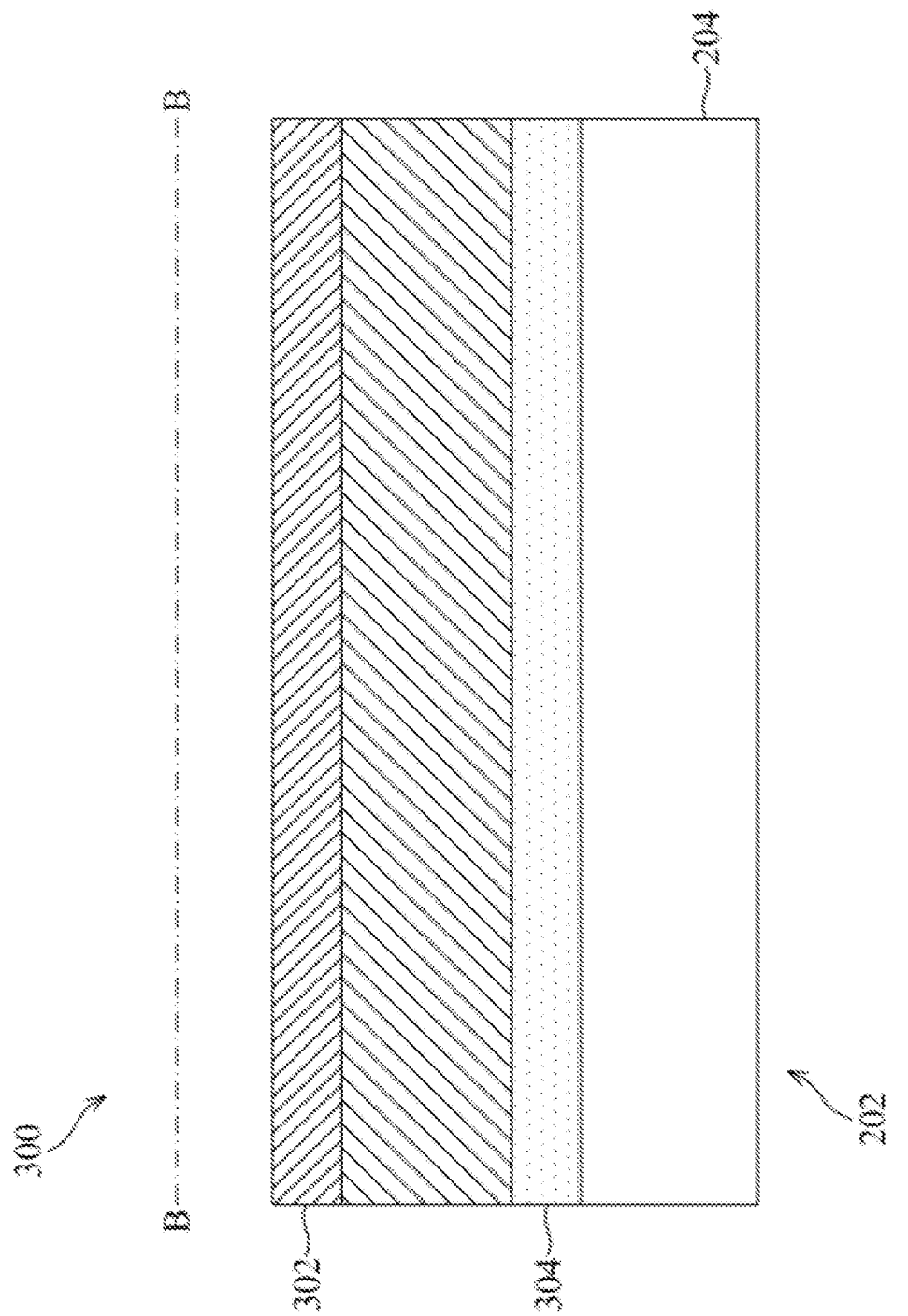

Turning to FIG. 3A, the example implementation 300 includes semiconductor processing operations relating to the semiconductor substrate 204 in and/or on which transistors are formed in the device region 202. The deposition tool 102 forms a hard mask layer 302 on the semiconductor substrate 204 using a CVD technique, a PVD technique, a spin-coating technique, and/or another deposition technique described above in connection with FIG. 1. The hard mask layer 302 includes a material having an etch selectivity to particular types of etchants that is different relative to the material of the semiconductor substrate 204 to facilitate etching of the semiconductor substrate 204. For example, the hard mask layer 302 may include a silicon nitride ($Si_xN_y$) or another suitable material, and the semiconductor substrate 204 may include a silicon oxide ($SiO_x$) or another suitable material.

In the example implementation 300, an insulator layer 304 is included within the semiconductor substrate 204. As described in greater detail in connection with FIGS. 7A-7C, different techniques using one or more combinations of the semiconductor processing tools 102-114 may form the insulator layer 304. The insulator layer 304 may include a dielectric material such as a silicon oxide ($SiO_x$) or another suitable material. The combination of the semiconductor substrate 204 and the insulator layer 304, in some implementations, is referred to as a silicon-on-insulator (SOI) substrate.

Figure 3B:
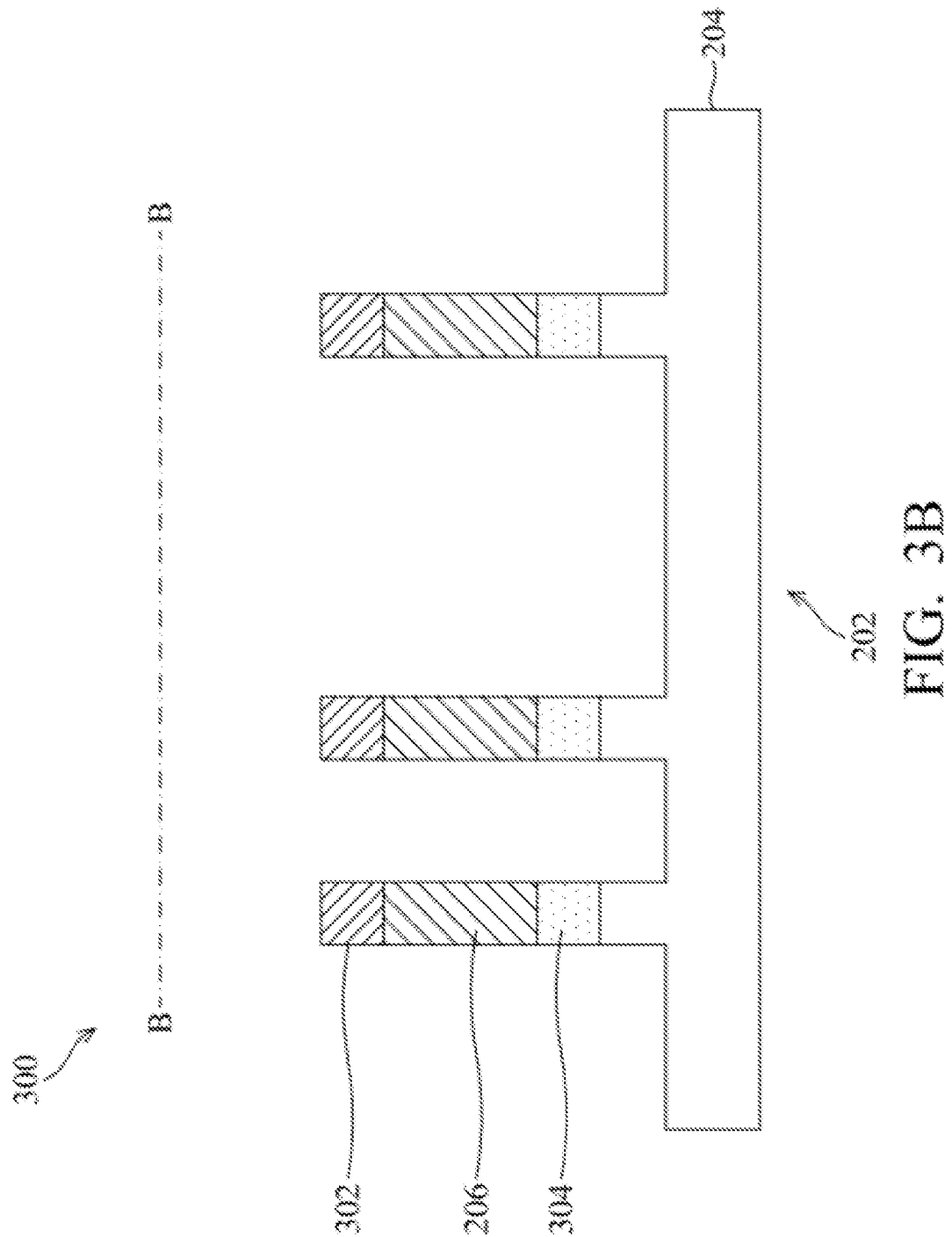

As shown in FIG. 3B, the fin structures 206 are formed in the semiconductor substrate 204 in the device region 202. In some implementations, a pattern in a photoresist layer is used to form the fin structures 206. In these implementations, the deposition tool 102 forms the photoresist layer on the hard mask layer 302. The exposure tool 104 exposes the photoresist layer to a radiation source to pattern the photoresist layer. The developer tool 106 develops and removes portions of the photoresist layer to expose the pattern. The etch tool 108 etches into the hard mask layer 302 to form a pattern in the hard mask layer 302. The semiconductor substrate 204 is then etched based on the pattern in the hard mask layer 302 to form the fin structures 206 in a portion of the semiconductor substrate 204. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). Each fin structure 206 includes a portion of the insulator layer 304.

Figure 3C:
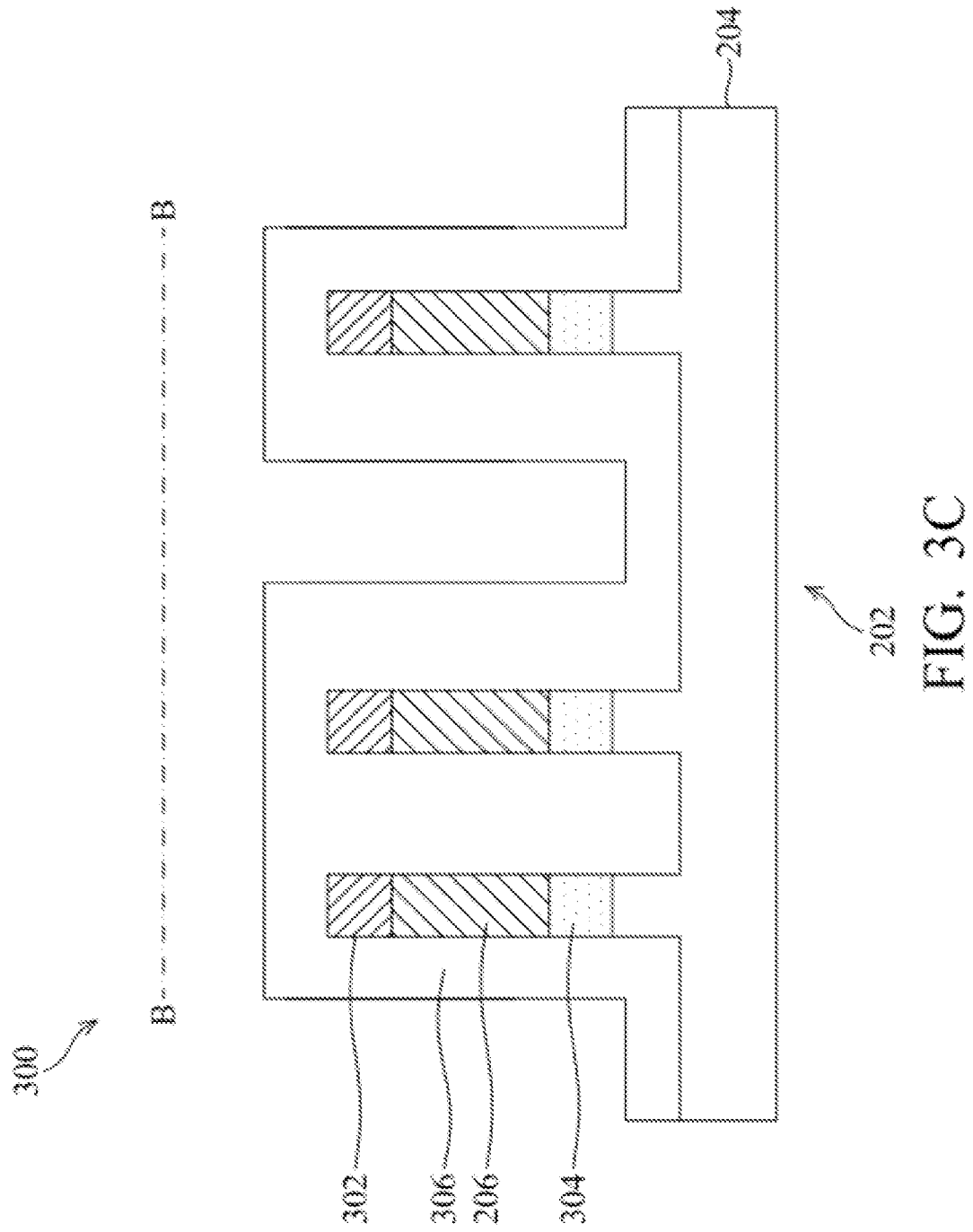

As shown in FIG. 3C, a dielectric layer 306 is formed over and/or on the semiconductor substrate 204 and over and/or on the fin structures 206 including the portions of the insulator layer 304. The deposition tool 102 deposits the dielectric layer 306 using a CVD technique, a PVD technique, an ALD technique, or another type of deposition technique described above in connection with FIG. 1. In some implementations, the dielectric layer 306 is conformally deposited on the fin structures 206 such that the dielectric layer 306 is formed on the tops and sidewalls of the fin structures 206.

Figure 3D:
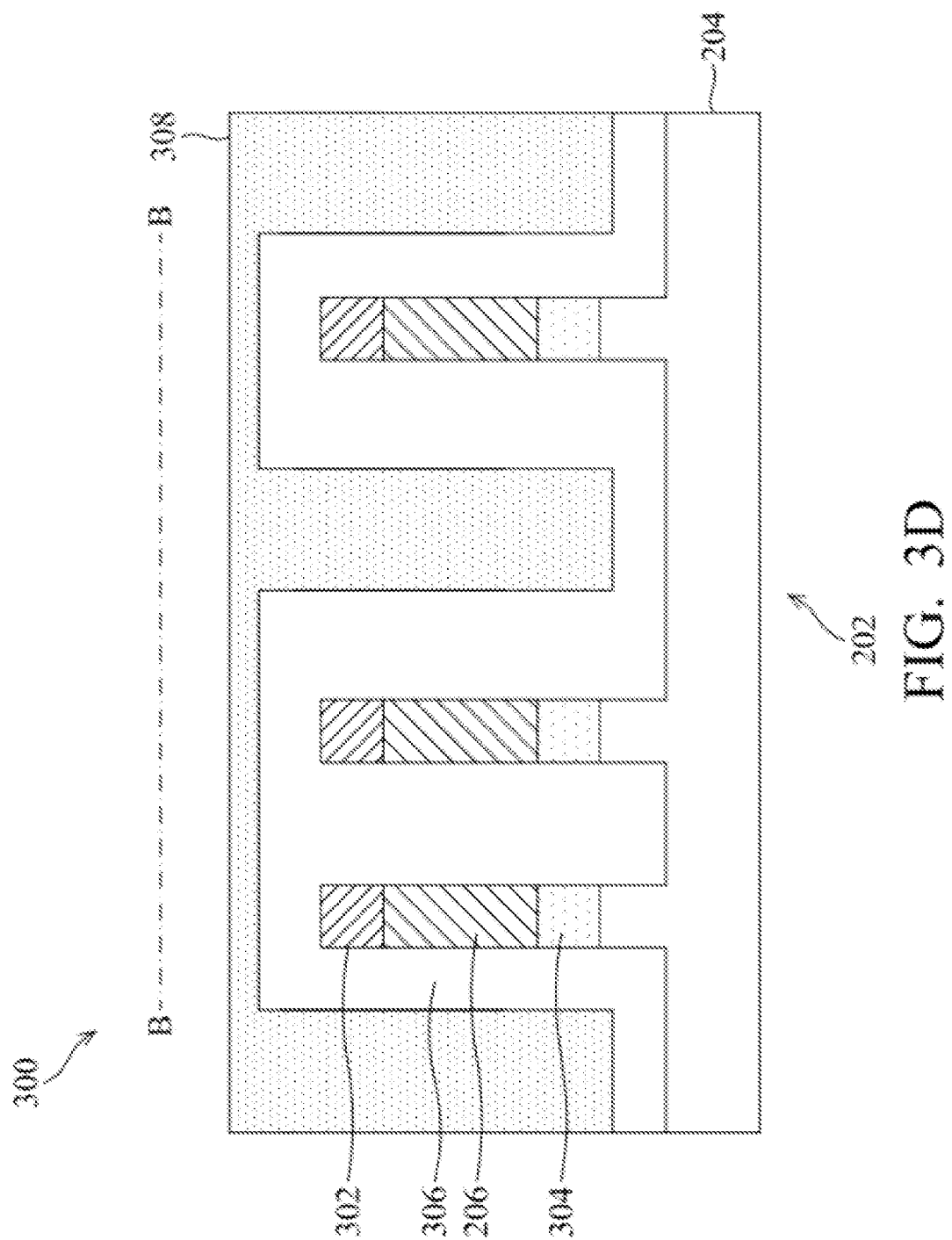

As shown in FIG. 3D, a low-k dielectric material layer 308 is formed in recesses in the dielectric layer 306 between the fin structures 206. The deposition tool 102 deposits the low-k dielectric material layer 308 using a CVD technique, a PVD technique, an ALD technique, or another type of deposition technique described above in connection with FIG. 1. In some implementations, the low-k dielectric material layer 308 is formed in a dielectric merge operation in which separate portions of the low-k dielectric material layer 308 are merged together.

As shown in FIG. 3E, the low-k dielectric material layer 308 is etched back such that a height of a top surface of the low-k dielectric material layer 308 is lesser relative to a height of a top surface of the dielectric layer 306. The etch tool 108 etches the low-k dielectric material layer 308 using a plasma etch technique, a wet chemical etch technique, and/or another type of etch technique. In some implementations, the low-k dielectric material layer 308 is etched back such that a height of a top surface of the low-k dielectric material layer 308 is greater relative to a height of a top surface of the hard mask layer 302, and is greater relative to a height of a top surface of the fin structures 206. In some implementations, the low-k dielectric material layer 308 is etched back such that a height of a top surface of the low-k dielectric material layer 308 is lesser relative to the height of a top surface of the hard mask layer 302, and is greater relative to the height of a top surface of the fin structures 206. In some implementations, the low-k dielectric material layer 308 is etched back such that a height of a top surface of the low-k dielectric material layer 308 is lesser relative to the height of a top surface of the hard mask layer 302, and is lesser relative to the height of a top surface of the fin structures 206.

Figure 3F:
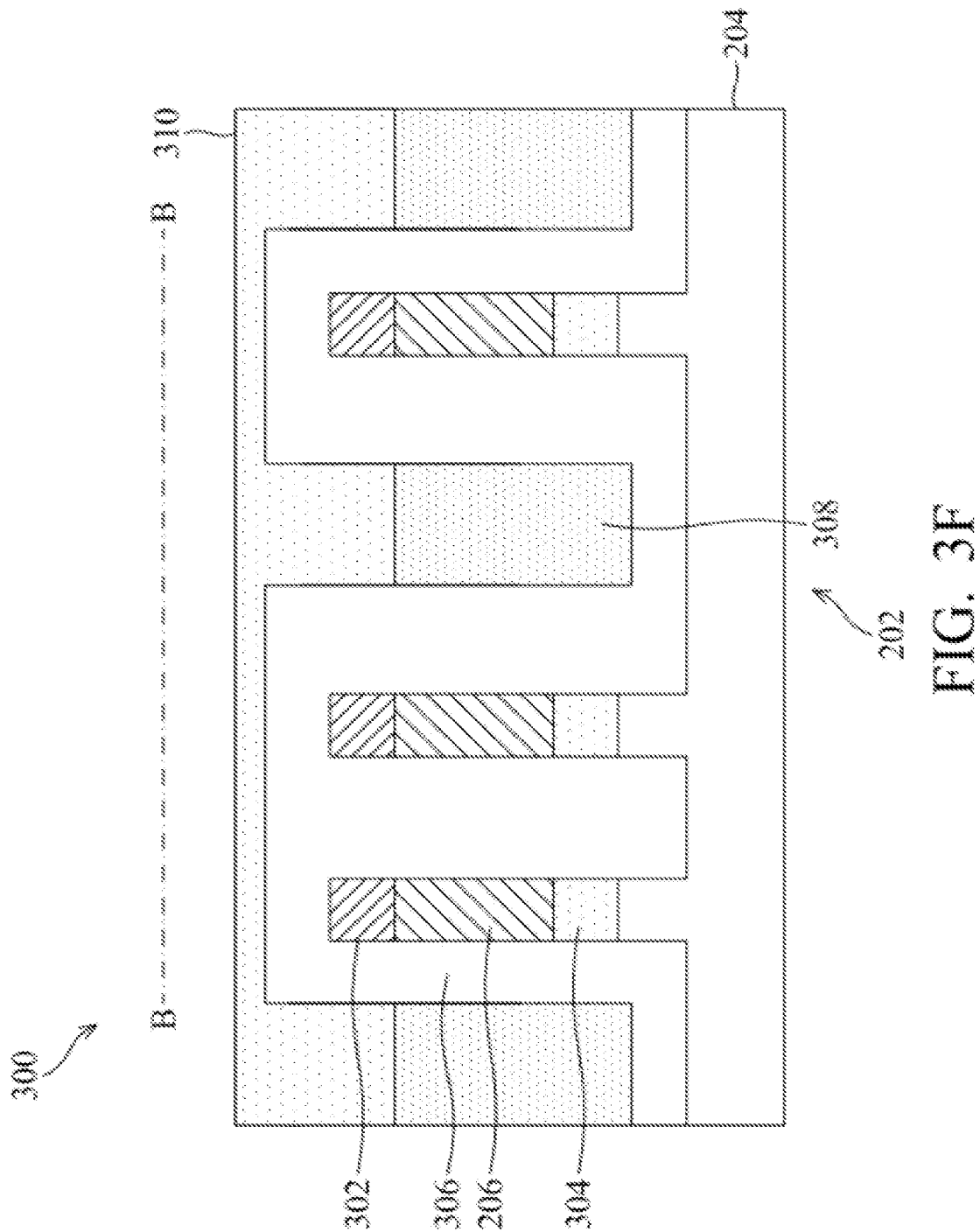

As shown in FIG. 3F, a high-k dielectric material layer 310 is formed in recesses in the dielectric layer 306 between the fin structures 206 including the portions of the insulator layer 304. Moreover, the high-k dielectric material layer 310 is formed on the low-k dielectric material layer 308. The deposition tool 102 deposits the high-k dielectric material layer 310 using a CVD technique, a PVD technique, an ALD technique, or another type of deposition technique described above in connection with FIG. 1. In some implementations, the high-k dielectric material layer 310 is formed in a dielectric merge operation in which separate portions of the high-k dielectric material layer 310 are merged together.

Figure 3G:
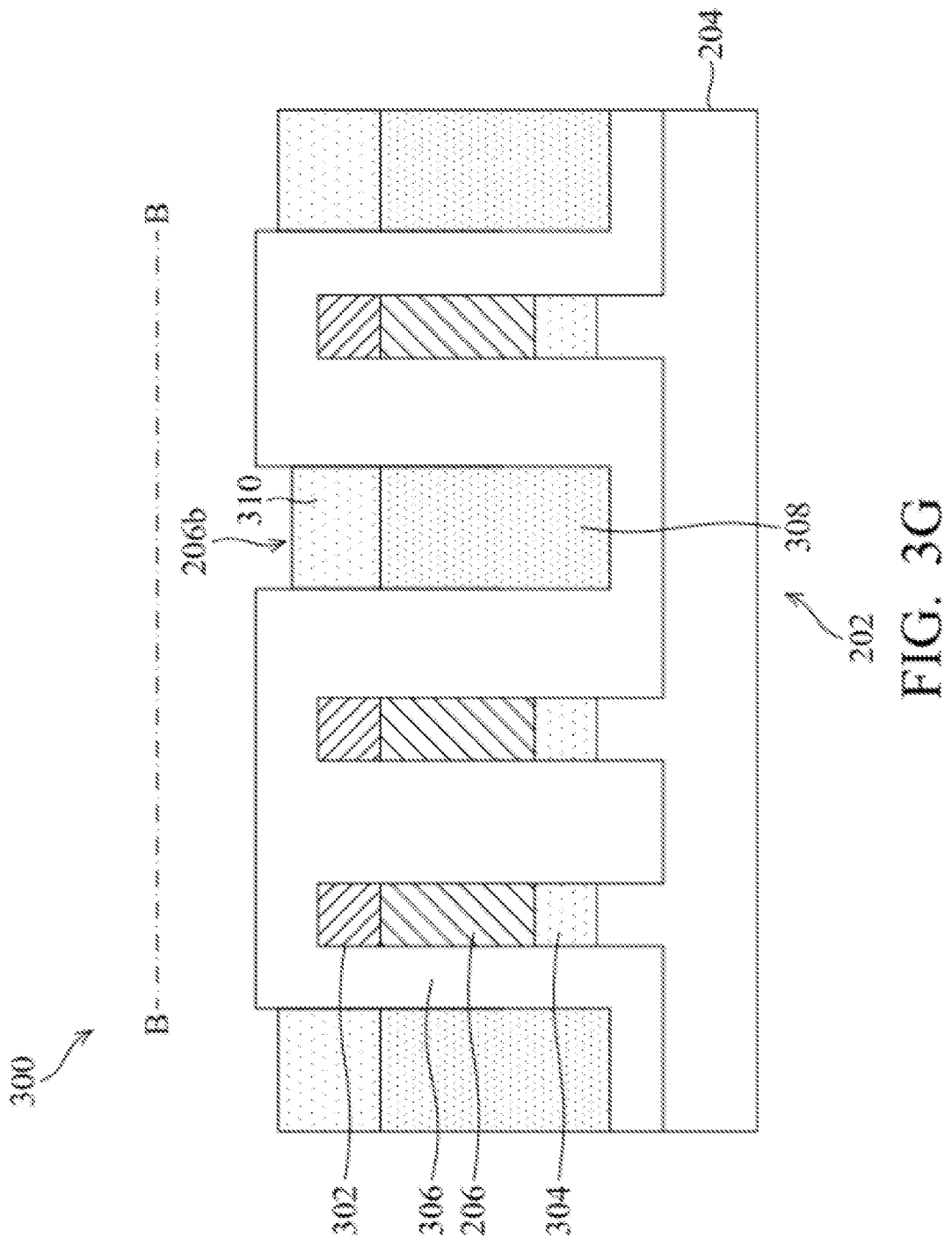

As shown in FIG. 3G, the high-k dielectric material layer 310 is etched to form the hybrid fin structures 208. The hybrid fin structures 208 each include a portion of the low-k dielectric material layer 308 and a portion of the high-k dielectric material layer 310. The high-k dielectric material layer 310 is etched such that a height of a top surface of the high-k dielectric material layer 310 is lesser relative to a height of a top surface of the dielectric layer 306. The etch tool 108 etches the low-k dielectric material layer 308 using a plasma etch technique, a wet chemical etch technique, and/or another type of etch technique.

In some implementations, the high-k dielectric material layer 310 is etched back such that a height of a top surface of the high-k dielectric material layer 310 is greater relative to a height of a top surface of the hard mask layer 302, and is greater relative to a height of a top surface of the fin structures 206. In some implementations, the high-k dielectric material layer 310 is etched back such that a height of a top surface of the high-k dielectric material layer 310 is lesser relative to the height of a top surface of the hard mask layer 302, and is greater relative to the height of a top surface of the fin structures 206. In some implementations, the high-k dielectric material layer 310 is etched back such that a height of a top surface of the high-k dielectric material layer 310 is lesser relative to the height of a top surface of the hard mask layer 302, and is lesser relative to the height of a top surface of the fin structures 206.

Figure 3H:
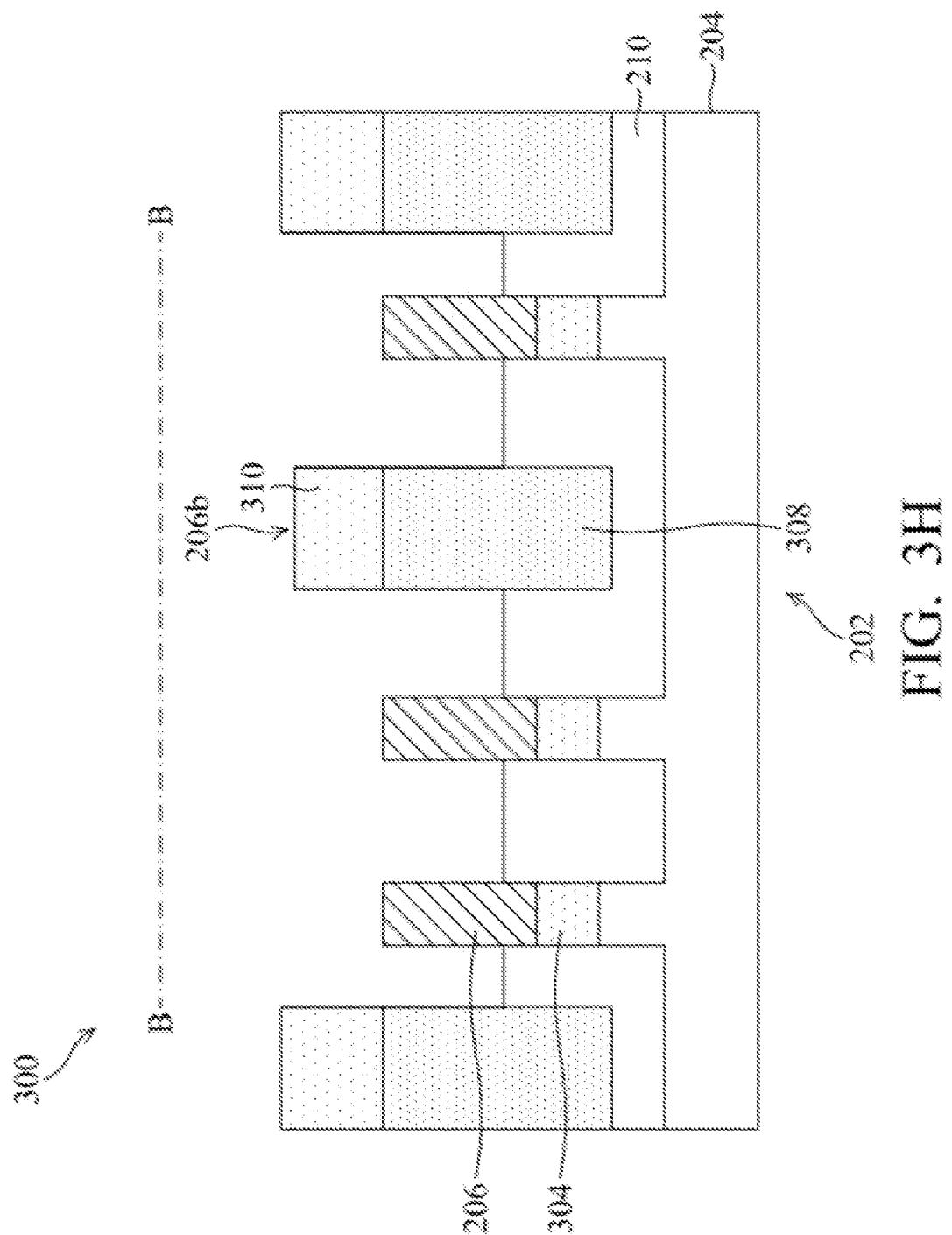

As shown in FIG. 3H, the dielectric layer 306 is etched to form the STI regions 210 between adjacent fin structures 206 and/or between adjacent pairs of a fin structure 206 and a hybrid fin structure 208. In this way, portions of the fin structures 206 are exposed so that the epitaxial regions (or source/drain regions) can be formed on the exposed portion of the fin structures 206 above the STI regions 210. The dielectric layer 306 is etched such that top surfaces of the STI regions 210 are below the tops of the fin structures 206. Moreover, the dielectric layer 306 is etched such that top surfaces of the STI regions 210 are above the top surfaces of the portions of the insulator layer 304 in fin structures 206. In this way, the portions of the insulator layer 304 are below the top surfaces of the STI regions 210.

In some implementations, a pattern in a photoresist layer is used to etch the dielectric layer 306 to form the STI regions 210. In these implementations, the deposition tool 102 forms the photoresist layer on the dielectric layer 306 and on the high-k dielectric material layer 310. The exposure tool 104 exposes the photoresist layer to a radiation source to pattern the photoresist layer. The developer tool 106 develops and removes portions of the photoresist layer to expose the pattern. The etch tool 108 etches the dielectric layer 306 based on the pattern to form the STI regions 210. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the STI regions 210 based on a pattern. In some implementations, the dielectric layer 306 is etched based on the etch selectivity between the material of the dielectric layer 306 and the material of the high-k dielectric material layer 310 (e.g., without a hard mask or a photoresist layer on the high-k dielectric material layer 310).

As indicated above, FIGS. 3A-3H are provided as an example. Other examples may differ from what is described with regard to FIGS. 3A-3H.

FIGS. 4A-4D are diagrams of an example implementation 400 described herein. The example implementation 400 includes an example of forming dummy gate structures and forming additional layers (e.g., one or more spacer layers of material) over the fin structures 206 including respective portions of the insulator layer 304. FIGS. 4A-4D are illustrated from one or more perspectives illustrated in FIG. 2, including the perspective of the cross-sectional plane A-A in FIG. 2 for the device region 202 and the perspective of the cross-sectional plane B-B in FIG. 2 for the device region 202. In some implementations, processing operations described in connection with the example implementation 400 are performed after the fin formation process described in connection with FIGS. 3A-3H and performed by one or more of the semiconductor processing tools 102-114.

As shown in FIG. 4A, the dummy gate structures 212 are formed in the device region 202. The dummy gate structures 212 are formed and included over the fin structures 206, and around the sides of the fin structures 206 such that the dummy gate structures 212 surround the fin structure 206 on at least three sides of the fin structure 206. Similarly, the dummy gate structures 212 are formed and included over the hybrid fin structures 208, and around the sides of the hybrid fin structures 208 such that the dummy gate structures 212 surround the hybrid fin structures 208 on at least three sides of the hybrid fin structures 208.

The dummy gate structures 212 are formed as placeholders for the actual gate structures (e.g., replacement high-k gate structures or metal gate structures) that are to be formed for the transistors included in the device region 202. The dummy gate structures 212 may be formed as part of a replacement gate process, which enables other layers and/or structures to be formed prior to formation of the replacement gate structures.

The dummy gate structures 212 include gate dielectric layers 214, gate electrode layers 216, and hard mask layers 218. The gate dielectric layers 214 may each include dielectric oxide layers. As an example, the gate dielectric layers 214 may each be formed (e.g., by the deposition tool 102) by chemical oxidation, thermal oxidation, ALD, CVD, and/or one or more other suitable methods. The gate electrode layers 216 may each include a poly-silicon layer or one or more other suitable layers. For example, the gate electrode layers 216 may be formed (e.g., by the deposition tool 102) by suitable deposition processes such as LPCVD or PECVD, among other examples. The hard mask layers 218 may each include any material suitable to pattern the gate electrode layers 216 with particular dimensions and/or attributes. Examples include silicon nitride, silicon oxynitride, silicon carbon nitride, or a combination thereof, among other examples. The hard mask layers 218 may be deposited (e.g., by the deposition tool 102) by CVD, PVD, ALD, or another deposition technique.

As further shown in FIG. 4A, seal spacer layers 402 are included on the sidewalls of the dummy gate structures 212. The seal spacer layers 402 may be conformally deposited (e.g., by the deposition tool 102) and may include a silicon oxycarbide (SiOC), a nitrogen free SiOC, or another suitable material. The seal spacer layers 402 may be formed using an ALD operation in which various types of precursor gasses including silicon (Si) and carbon (C) are sequentially supplied in a plurality of alternating cycles to form the seal spacer layers 402, among other example deposition techniques.

As further shown in FIG. 4A, bulk spacer layers 404 may be formed on the seal spacer layers 402. The bulk spacer layers 404 may be formed of similar materials as the seal spacer layers 402. However, the bulk spacer layers 404 may be formed without plasma surface treatment that is used for the seal spacer layers 402. Moreover, the bulk spacer layers 404 may be formed to a greater thickness relative to the thickness of the seal spacer layers 402.

In some implementations, the seal spacer layers 402 and the bulk spacer layers 404 are conformally deposited (e.g., by the deposition tool 102) on the dummy gate structures 212, and on the fin structures 206. The seal spacer layers 402 and the bulk spacer layers 404 are then patterned (e.g., by the deposition tool 102, the exposure tool 104, and the developer tool 106) and etched (e.g., by the etch tool 108) to remove the seal spacer layers 402 and the bulk spacer layers 404 from the tops of the dummy gate structures 212, from the fin structures 206, and from the hybrid fin structures 208.

Figure 4B:
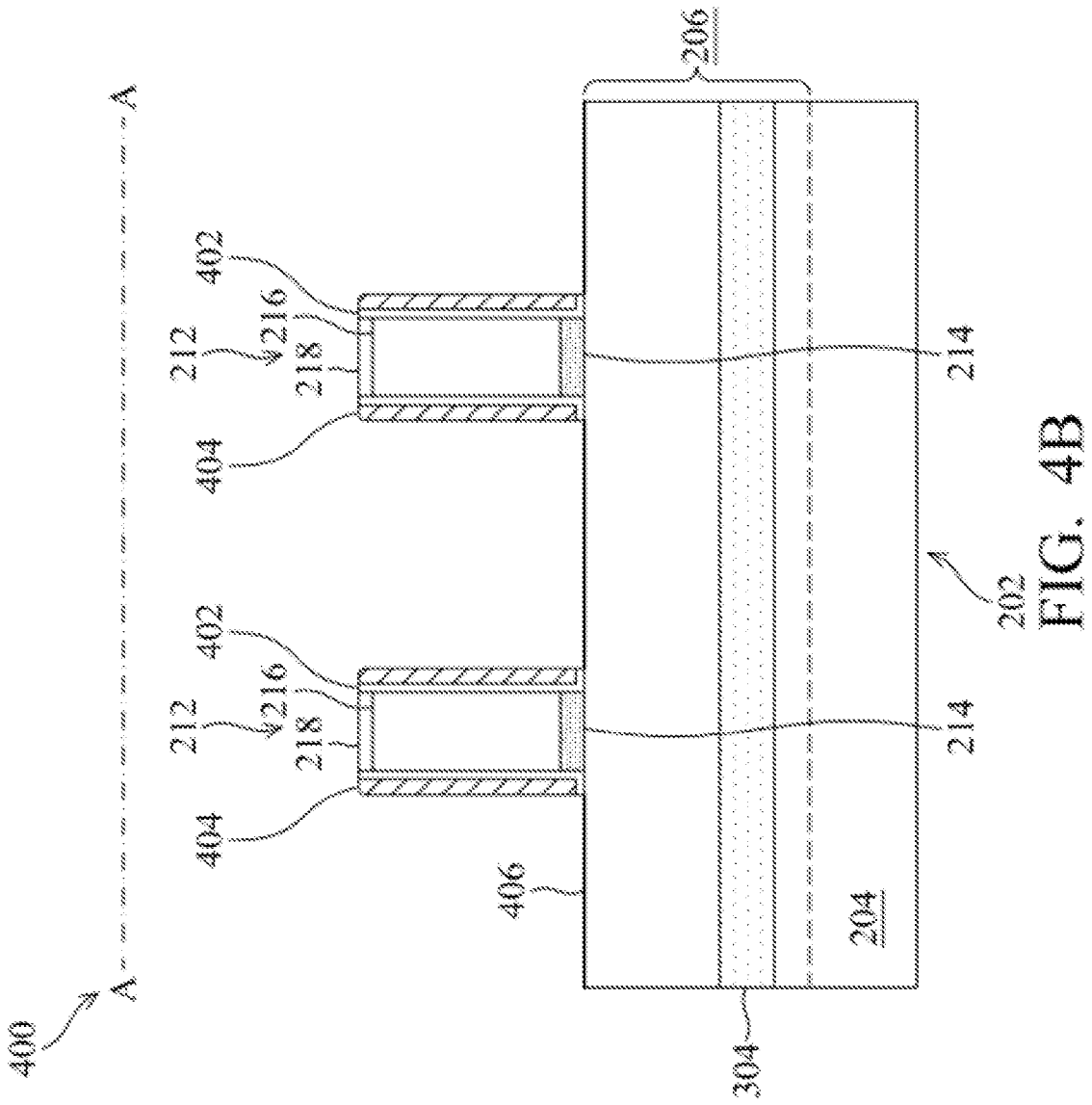
Figure 4C:
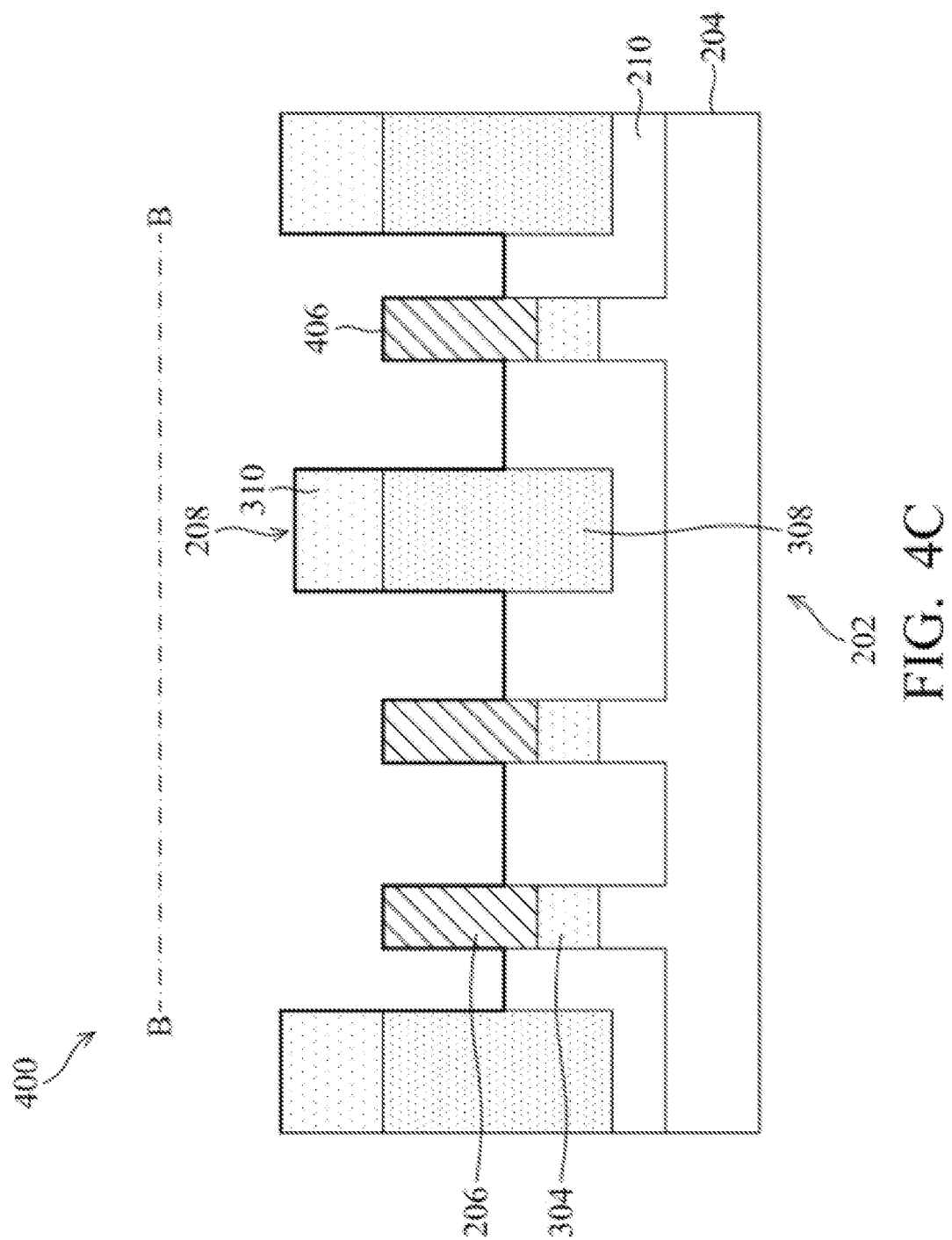

As shown in FIG. 4B and FIG. 4C, a spacer layer 406 is formed on the fin structures 206, on the hybrid fin structures 208, and on the STI regions 210. The spacer layer 406 includes a silicon oxycarbide (SiOC), a nitrogen free SiOC, a silicon nitride ($Si_xN_y$), and/or another suitable material. In some implementations, the spacer layer 406 includes a plurality of spacer layers. In some implementations, the spacer layer 406 and one or more of the seal spacer layers 402 and/or the bulk spacer layers 404 are the same spacer layer(s). The deposition tool 102 deposits the spacer layer 406 using a CVD technique, a PVD technique, an ALD technique, or another type of deposition technique described above in connection with FIG. 1. As shown in FIGS. 4B and 4C, the spacer layer 406 is conformally deposited on the top surfaces and the sidewalls of the fin structures 206, on the top surfaces and the sidewalls of the hybrid fin structures 208, and on the top surfaces of the STI regions 210.

Figure 4D:
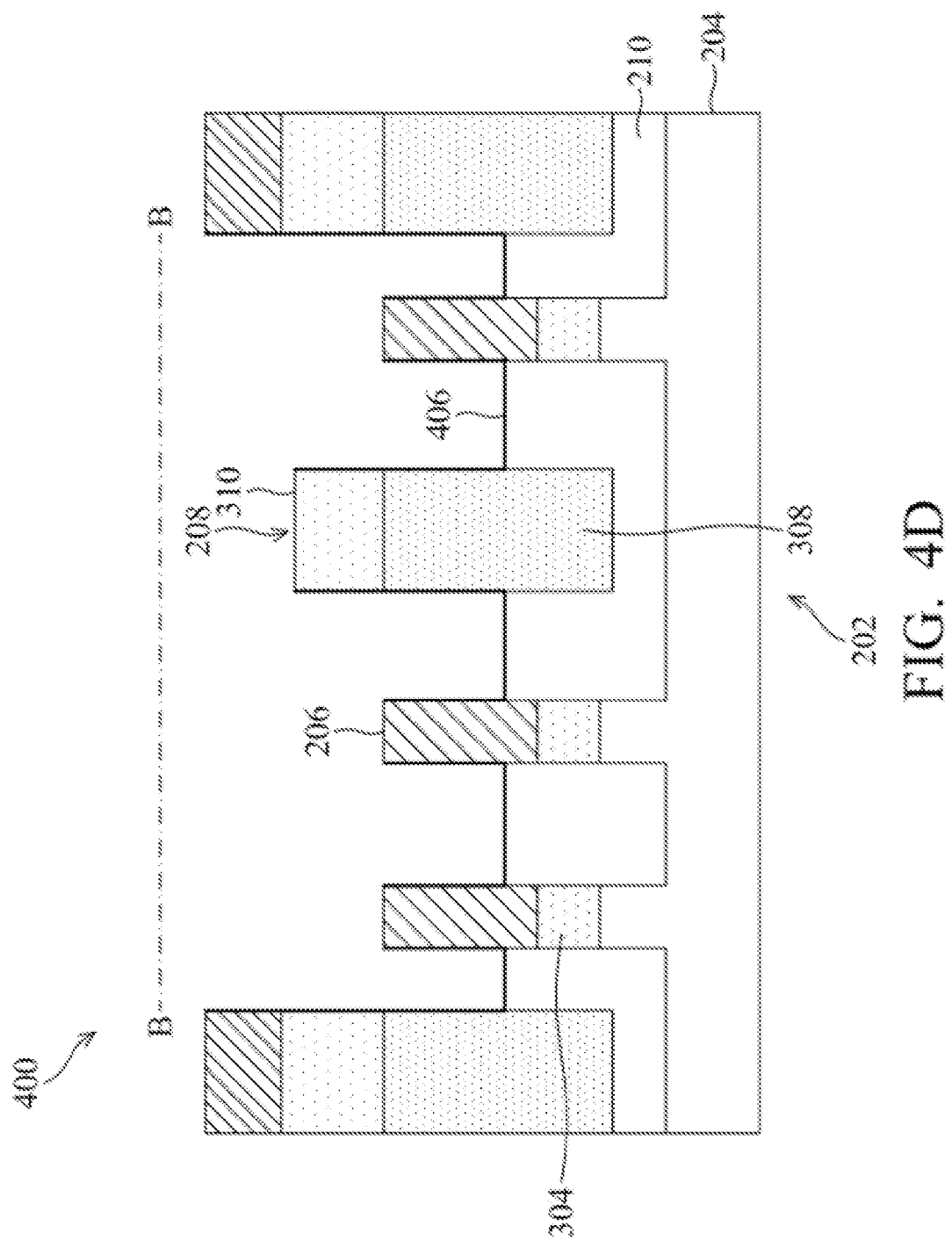

As shown in FIG. 4D, portions of the spacer layer 406 are removed from the top surfaces of the fin structures 206 and from the top surfaces of the hybrid fin structures 208. The etch tool 108 may remove the portions of the spacer layer 406. The etch operation to remove the portions of the spacer layer 406 may be referred to as a fin top opening operation, and may be performed to facilitate etching of the fin structures 206.

As indicated above, FIGS. 4A-4D are provided as an example. Other examples may differ from what is described with regard to FIGS. 4A-4D.

FIGS. 5A-5F are diagrams of an example implementation 500 described herein. In connection with forming the fin structure 206 in the semiconductor substrate 204 as described in connection with FIGS. 3A-3H and 4A-4D, the example implementation 500 includes processing operations to form epitaxial regions that correspond to source/drain regions of transistors included in the device region 202. FIGS. 5A-5F are illustrated from the perspective of the cross-sectional plane B-B in FIG. 2 for the device region 202. The example implementation 500 further includes processing operations to a form metal source/drain contact (MD) structure included in the device region 202.

Figure 5B:
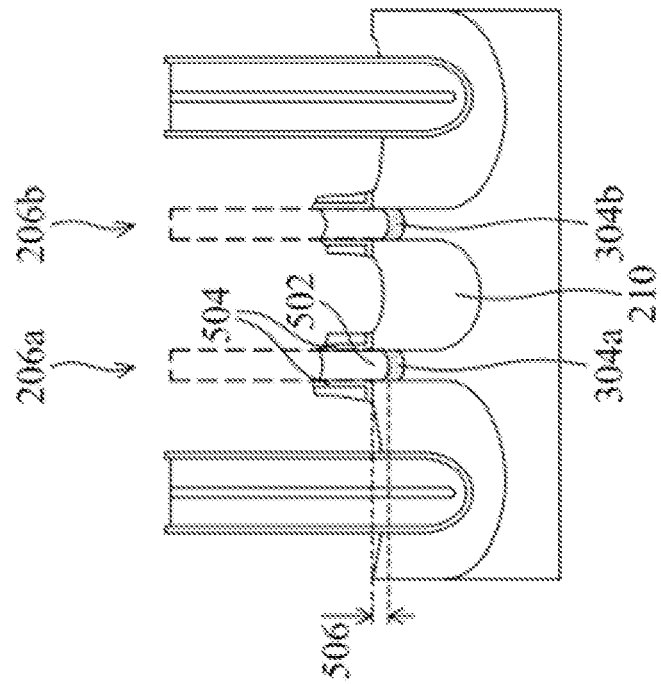
Figure 5A:
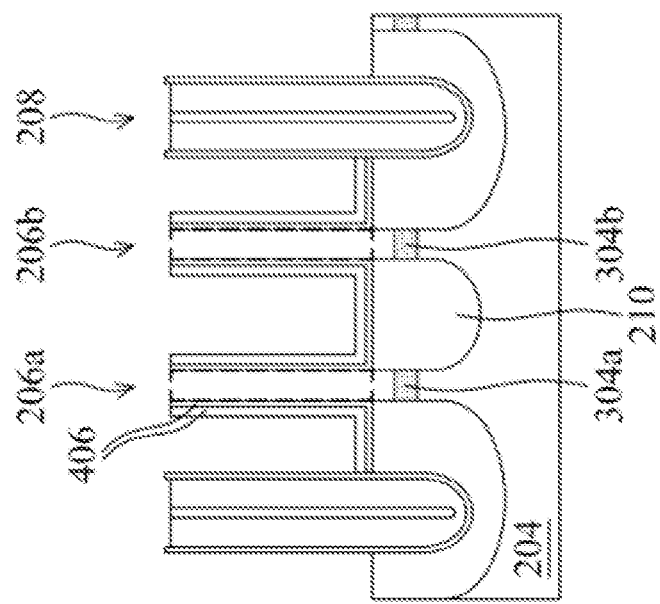

FIG. 5A shows a fin structure 206a, a fin structure 206b, and a hybrid fin structure 208 above the semiconductor substrate 204. The STI region 210 is between the fin structure 206a and the fin structure 206b. Below the fin structure 206a is a portion of the insulator layer 304a (e.g., the insulator layer 304a includes a dielectric layer, such as an oxide layer among other examples, and may be included as part of the fin structure 206a). The portion of the insulator layer 304a, as shown, may be located at or near a bottom of the fin structure 206a. Another portion of the insulator layer 304b (e.g., the insulator layer 304b includes a dielectric layer, such as an oxide layer among other examples, and may be included as part of the fin structure 206b). The portion of the insulator layer 304b, as shown, may be located at or near a bottom of the fin structure 206b. Further, and as shown in FIG. 5A, a plurality of spacer layers 406 are on sidewalls of the fin structures 206a and 206b.

FIG. 5B shows forming recesses 502 in the fin structures 206. As an example, the etch tool 108 of FIG. 1 may selectively etch the fin structures 206 to form the recesses 502. Selectively etching the fin structures 206 may also include selectively etching the spacer layers 406 to form one or more fin sidewall spacers 504. The etch tool 108 may perform a strained source/drain (SSD) etch operation to form the recesses 502. Accordingly, the recesses 502 may be referred as SSD recesses.

In some implementations, and as shown, the recesses 502 are formed to, or into, portions of the insulator layers 304a and 304b. This enables the source/drain regions to be formed over and/or on the insulator layers 304a and 304b. In this way, the insulator layers 304a and 304b are configured to reduce and/or minimize leakage (e.g., current leakage, electron leakage, electron hole leakage) under the source/drain regions. In some implementations, the recesses 502 are formed to top surfaces of the insulator layers 304a and 304b. In some implementations, the recesses 502 are formed into a portion of the insulator layers 304a and 304b. As a result, the top surfaces of insulator layers 304a and 304b may be concave and/or rounded. A top surface of the recesses 502 may be formed to a depth 506 that is in a range from approximately 5 nanometers to approximately 30 nanometers below a top surface of the STI region 210. For a depth 506 that is less than this range, a transistor in the device region 202 may not function electrically, while for a depth 506 that is greater than this range, leakage from the transistor may increase. However, other values and ranges for the depth 506 are within the scope of the present disclosure.

Figure 5D:
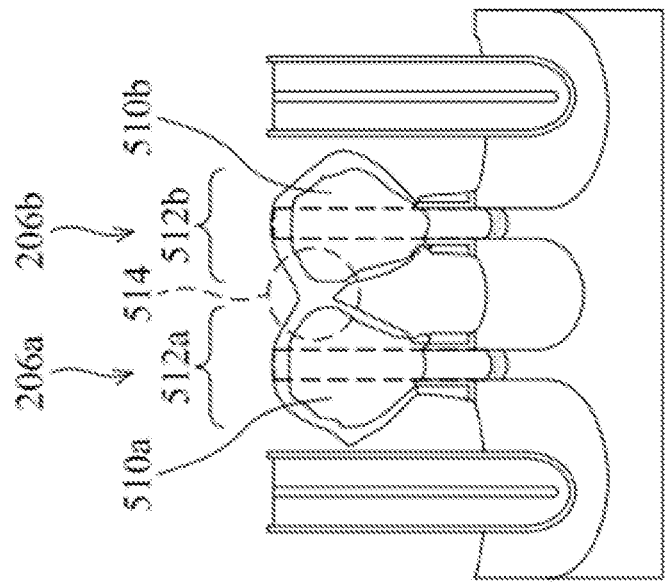
Figure 5C:
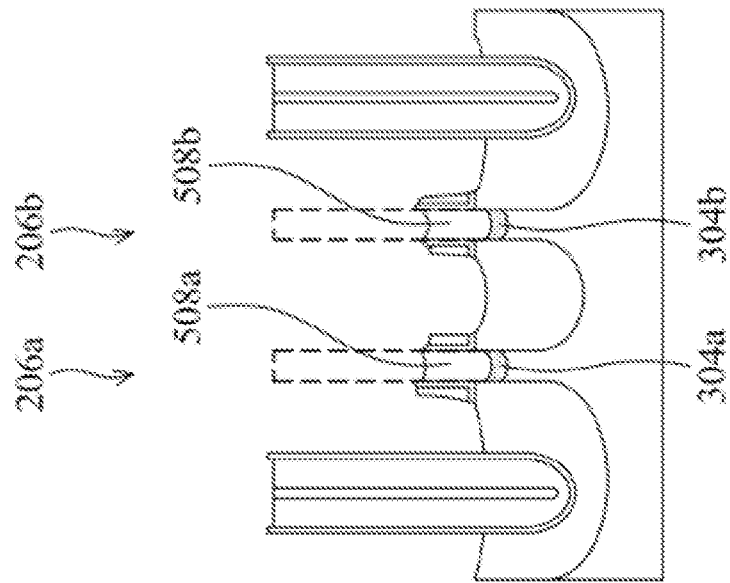

FIG. 5C shows forming epitaxial layers 508 (e.g., the epitaxial layer 508a and the epitaxial layer 508b) on the insulator layers 304 and between the fin sidewall spacers 504. In some implementations, the epitaxial layers 508 are lightly doped. The epitaxial layer 508a extends into the fin structure 206a and the epitaxial layer 508b extends into the fin structure 206b. A combination of processing operations, including deposition processing operations performed by the deposition tool 102, etching processing operations performed by the etch tool 108 of FIG. 1, among other examples, may form the epitaxial layers 508.

For an implementation where the fin structures 206 correspond to NMOS-type fins, forming the epitaxial layers 508 may include depositing and etching a silicon material including an arsenic dopant (SiAs). As an example, a concentration of the arsenic dopant may be in a range from approximately $1 \times 10^{19}$ atoms per cubic centimeter to approximately $5 \times 10^{20}$ atoms per cubic centimeter. However, other values and ranges for the concentration of the arsenic dopant in the epitaxial layers 508 of NMOS-type fins are within the scope of the present disclosure.

For an implementation where the fin structures 206 correspond to PMOS-type fins, forming the epitaxial layers 508 may include depositing and etching a silicon-germanium material including a boron dopant (SiGeB). As an example, a concentration of the boron dopant may be in a range from approximately $8 \times 10^{19}$ atoms per cubic centimeter to approximately $3 \times 10^{20}$ atoms per cubic centimeter. Additionally, or alternatively, a content of germanium may range from approximately 15% to approximately 18%. However, other values and ranges for the concentration of the boron dopant or the content of germanium in the epitaxial layers 508 of PMOS-type fins are within the scope of the present disclosure.

A thickness of the epitaxial layers 508 (e.g., relative to a top surface of the insulator layers 304) may be in a range from approximately 3 nanometers to approximately 15 nanometers. However, other values and ranges for the thickness of the epitaxial layers 508 are within the scope of the present disclosure.

FIG. 5D shows forming epitaxial layers 510 (e.g., the epitaxial layer 510a and the epitaxial layer 510b) on the epitaxial layers 508 above the fin sidewall spacers 504. In some implementations, the epitaxial layers 510 are more heavily doped than the epitaxial layers 508. As shown, epitaxial layers 510 combine with the epitaxial layers 508 to form epitaxial regions 512 (e.g., epitaxial region 512a and epitaxial region 512b). Forming the epitaxial layers 510 may include forming the merged-epitaxial sub-region 514. The merged-epitaxial sub-region 514 may join the epitaxial region 512a to the epitaxial region 512b.

Forming the epitaxial layers 510 may include a combination of processing operations, including deposition operations performed by the deposition tool 102 and etching operations performed by the etch tool 108 of FIG. 1. As an example, and for an implementation where the fin structures 206 correspond to NMOS-type fins, forming the epitaxial layers 510 may include depositing and etching a silicon material including a phosphorous dopant (SiP). A concentration of the phosphorous dopant may be in a range from approximately $1 \times 10^{20}$ atoms per cubic centimeter to approximately $5 \times 10^{21}$ atoms per cubic centimeter. However, other values and ranges for the concentration for the phosphorous dopant in the epitaxial layers 510 of NMOS-type fins are within the scope of the present disclosure.

As another example, and for an implementation where the fin structures 206 correspond to PMOS-type fins, forming the epitaxial layers 510 may include depositing and etching a silicon-germanium material including a boron dopant (SiGeB). As an example, a concentration of the boron dopant may be in a range from approximately $4 \times 10^{20}$ atoms per cubic centimeter to approximately $1 \times 10^{21}$ atoms per cubic centimeter. Additionally, or alternatively, a content of germanium may range from approximately 40% to approximately 60%. However, other values and ranges for the concentration of the boron dopant or the content of germanium in the epitaxial layers 510 of PMOS-type fins are within the scope of the present disclosure.

A thickness of the epitaxial layers 510 (e.g., relative to a top surface of the epitaxial layers 508) may be in a range from approximately 30 nanometers to approximately 70 nanometers. However, other values and ranges for the thickness of the epitaxial layers 510 are within the scope of the present disclosure.

Figures 5E, 5F:
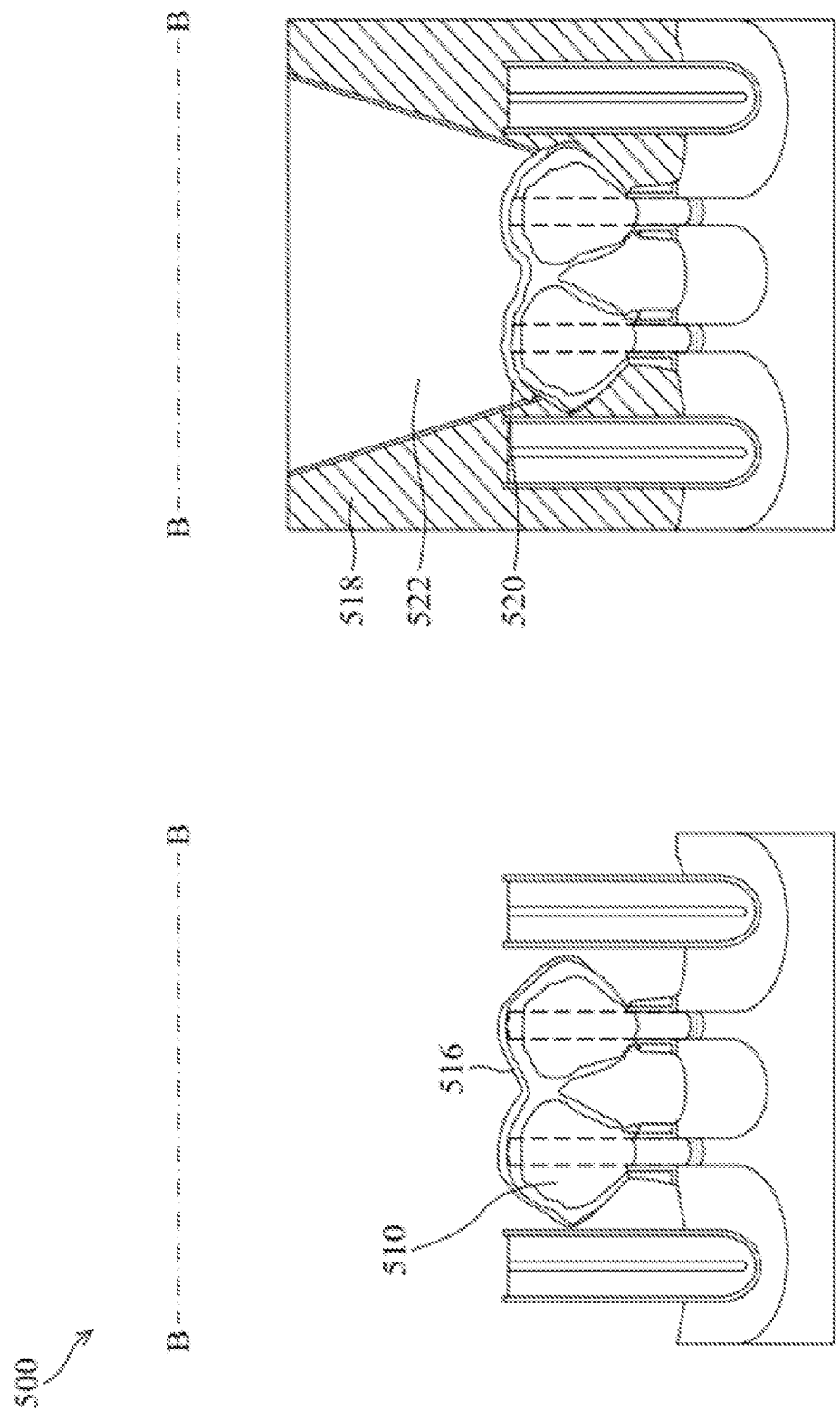

FIG. 5E shows an epitaxial layer 516 (e.g., a capping layer) formed over the epitaxial layers 510. A combination of processing operations, including deposition operations performed by the deposition tool 102 and etching operations performed by the etch tool 108 of FIG. 1, may form the epitaxial layer 516. As an example, and for an implementation where the fin structures 206 correspond to NMOS-type fins, forming the epitaxial layer 516 may include depositing and etching a silicon material including a phosphorous dopant (SiP). A concentration of the phosphorous dopant may be in a range from approximately $1 \times 10^{20}$ atoms per cubic centimeter to approximately $2 \times 10^{21}$ atoms per cubic centimeter. However, other values and ranges for the concentration for the phosphorous dopant in the epitaxial layers 516 of NMOS-type fins are within the scope of the present disclosure.

As another example, and for an implementation where the fin structures 206 correspond to PMOS-type fins, forming the epitaxial layer 516 may include depositing and etching a silicon-germanium material including a boron dopant (SiGeB). As an example, a concentration of the boron dopant may be in a range from approximately $8 \times 10^{19}$ atoms per cubic centimeter to approximately $8 \times 10^{20}$ atoms per cubic centimeter. Additionally, or alternatively, a content of germanium may range from approximately 10% to approximately 20%. However, other values and ranges for the concentration of the boron dopant or the content of the germanium in the epitaxial layers 516 of PMOS-type fins are within the scope of the present disclosure.

A thickness of the epitaxial layer 516 may be in a range from approximately 3 nanometers to approximately 10 nanometers. However, other values and ranges for the thickness of the epitaxial layer 516 are within the scope of the present disclosure.

FIG. 5F shows additional layers of materials which may be formed over the fin structures 206. The additional layers, which include an inner-layer dielectric (ILD) layer 518, a contact layer 520, and a conductive layer 522, may correspond to a metal source/drain contact (MD) structure.

A combination of processing operations, including deposition operations performed by the deposition tool 102 and etching operations performed by the etch tool 108 of FIG. 1, may form the layers 518-522. The deposition and etching operations may include depositing the ILD layer 518, etching a recess in the ILD layer 518, selectively etching tops of the epitaxial regions 512 (including the epitaxial layer 516), and depositing the contact layer 520. After deposition of the contact layer 520, the deposition tool 102 may fill the recess in the ILD layer 518 with the conductive layer 522 using a PVD operation. In some implementations, the planarization tool 110 of FIG. 1 performs a chemical-mechanical polish (CMP) operation to control a height of one or more portions of the MD contact structure (e.g., a height of the ILD layer 518 or a height of the conductive layer 522, among other examples).

In some implementations, the ILD layer 518 includes an aluminum oxynitride (AlON) material, a silicon nitride ($Si_xN_y$) material, or a silicon oxide ($Si_xO_y$) material, among other examples. In some implementations, the contact layer 520 includes a titanium (Ti) material. In some implementations, the conductive layer 522 includes a cobalt (Co) material, a tungsten (W) material, and/or a ruthenium (Ru) material, among other examples. However, other types of materials for the ILD layer 518, the contact layer 520, and the conductive layer 522 are within the scope of the present disclosure.

Processing operations of FIGS. 5A-5F, in connection with processing operations described in FIGS. 3A-3H and 4A-4D, may be performed to form the semiconductor device 200. The semiconductor device 200 includes the fin structure 206a (e.g., a first fin structure) above the semiconductor substrate 204 and the fin structure 206b (e.g., a second fin structure) above the semiconductor substrate 204 and adjacent to the fin structure 206a. The semiconductor device 200 also includes the epitaxial layer 508a (e.g., a first epitaxial layer) extending into the fin structure 206a and the epitaxial layer 508b (e.g., a second epitaxial layer) extending into the fin structure 206b. Furthermore, the semiconductor device 200 includes the insulator layer 304a (e.g., a first insulator layer) between the fin structure 206a and a bottom portion of the epitaxial layer 508a and also includes the insulator layer 304b between the fin structure 206b and a bottom portion of the epitaxial layer 508b.

The number and arrangement of processing operations shown in FIGS. 5A-5F are provided as one or more examples. In practice, there may be additional processing operations, fewer processing operations, different processing operations, or differently arranged processing operations than those shown in FIGS. 5A-5F. For example, additional or different processing operations may include masking and/or exposing portions of the device region 202 using a combination of the deposition tool 102, the exposure tool 104, and the developer tool 106. As another example, additional or different processing operations may include using the ion implantation tool 114 of FIG. 1 to implant ions and dope the epitaxial layers 508, 510, and/or 516.

Figure 6A:
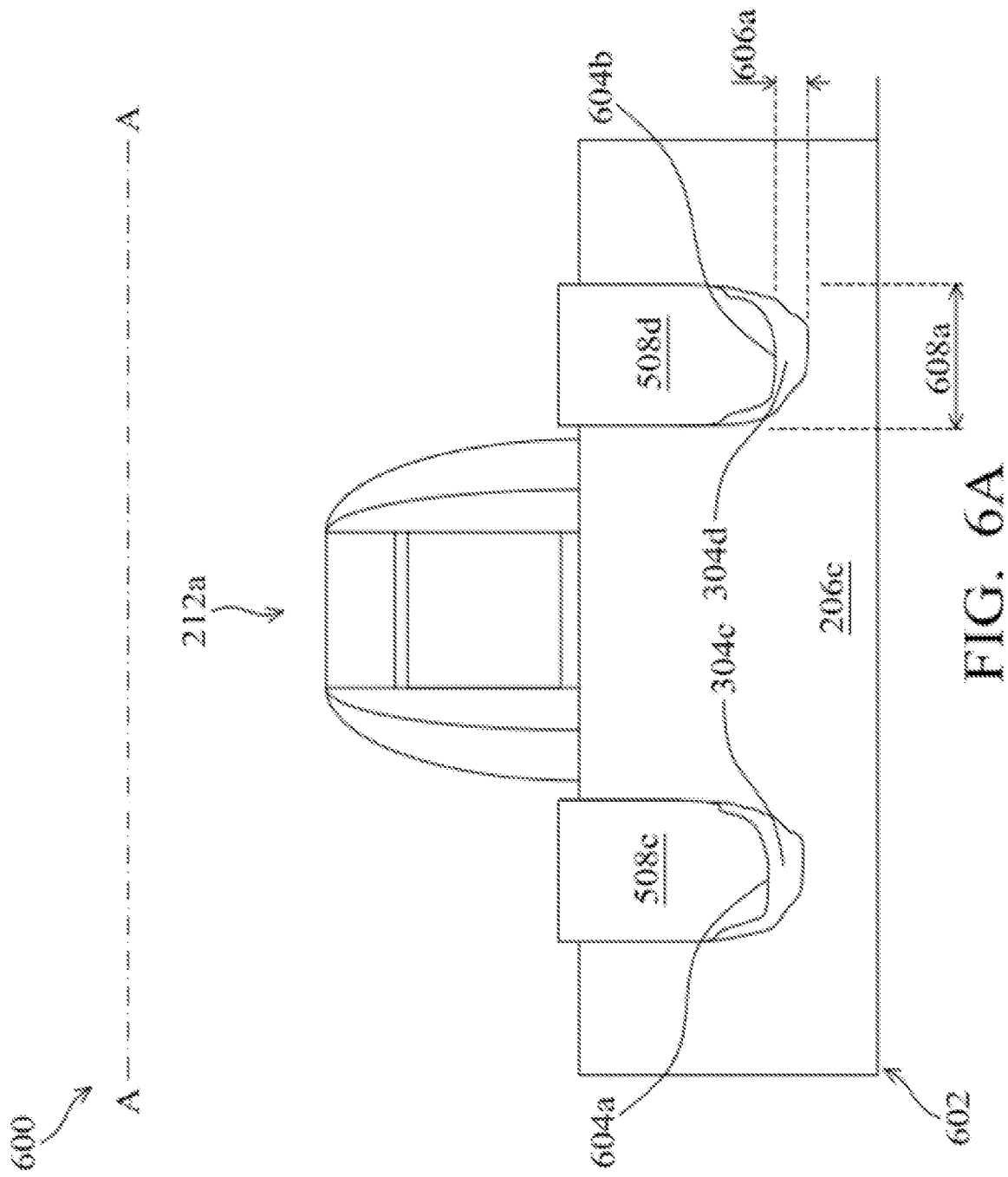
Figure 6B:
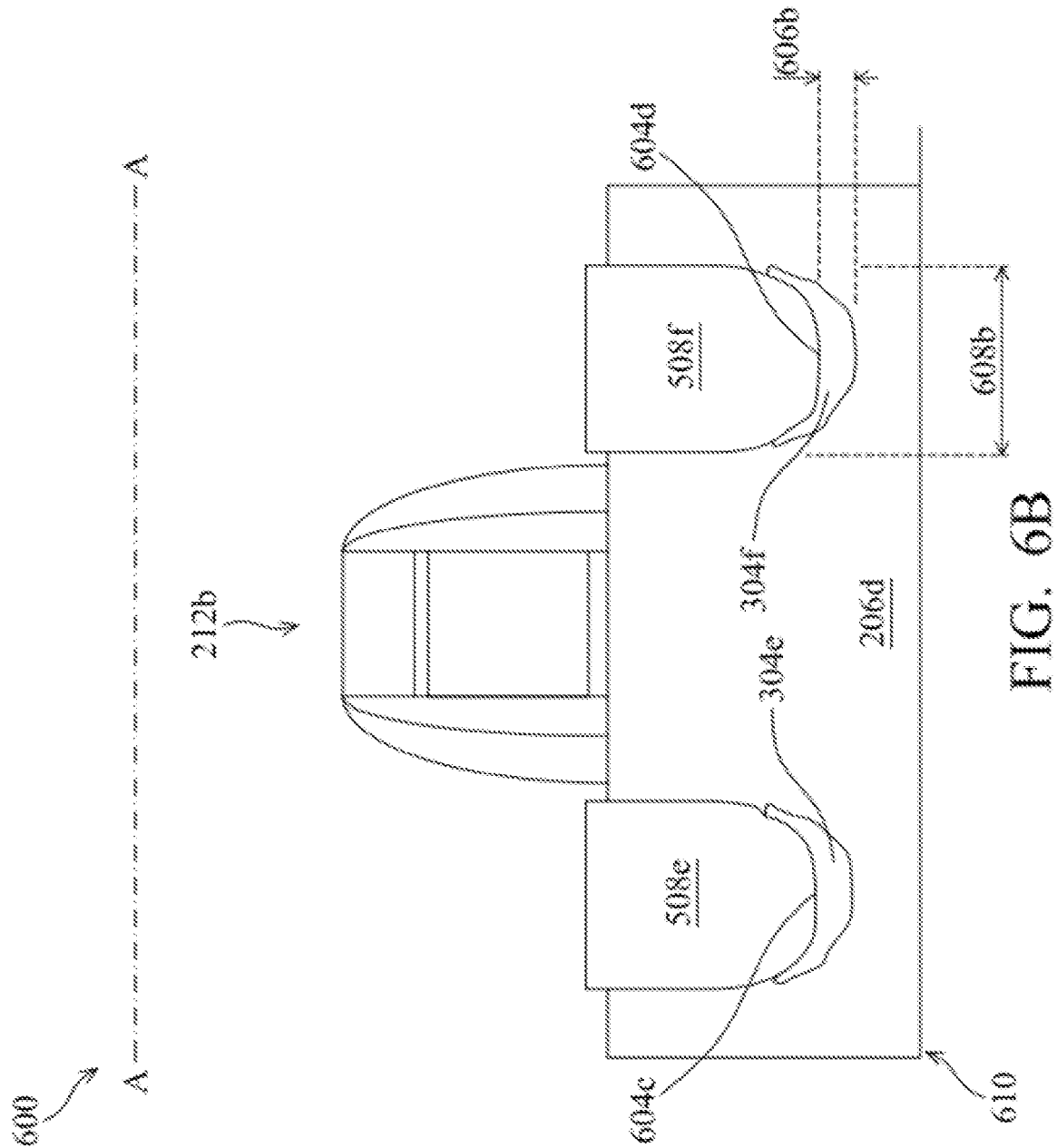

FIGS. 6A-6C are diagrams 600 of example types of devices described herein. The devices described in connection with diagrams 600 may be formed using one or more techniques described in connection with FIGS. 3A-3H, 4A-4C, and 5A-5F. Furthermore, FIGS. 6A-6C are illustrated from the perspective of the cross-sectional plane A-A in FIG. 2 for the device region 202.

FIG. 6A shows an example 602 that corresponds to an SRAM type of semiconductor device (e.g., a type of the semiconductor device 200). The example 602 includes a fin structure 206c (e.g., the fin structure 206 extending above the semiconductor substrate 204), an epitaxial layer 508c (e.g., a first epitaxial layer) extending into the fin structure 206c, and another epitaxial layer 508d (e.g., a second epitaxial layer) extending into the fin structure 206c adjacent to the epitaxial layer 508c. The gate structure 212a is between the epitaxial layer 508c and the epitaxial layer 508d.

The SRAM type of semiconductor device includes an insulator layer 304c (e.g., a first oxide layer or a first dielectric layer, among other examples) between a bottom surface 604a (e.g., a first bottom surface) of the epitaxial layer 508c and the fin structure 206c. The SRAM type of semiconductor device further includes another insulator layer 304d (e.g., a second oxide layer or a second dielectric layer, among other examples) between a bottom surface 604b (e.g., a second bottom surface) of the epitaxial layer 508d and the fin structure 206c.

At least one of the insulator layer 304c or the insulator layer 304d includes a thickness 606a and a width 608a. The thickness 606a may be in a range from approximately 3 nanometers to approximately 13 nanometers, and the width 608a may be in a range from approximately 10 nanometer to approximately 30 nanometers. For a thickness 606a and a width 608a that are less than these ranges, leakage within a transistor of the SRAM type of semiconductor device may increase. For a thickness 606a and a width 608a that are greater than these ranges, an activation voltage for the transistor of the SRAM type of semiconductor device may increase beyond operability. However, other values and ranges for the thickness 606a and the width 608a are within the scope of the present disclosure.

FIG. 6B shows an example 610 that corresponds to a RO type of semiconductor device (e.g., a type of the semiconductor device 200). The example 610 includes a fin structure 206d (e.g., the fin structure 206 extending above the semiconductor substrate 204), an epitaxial layer 508e (e.g., a first epitaxial layer) extending into the fin structure 206d, and another epitaxial layer 508f (e.g., a second epitaxial layer) extending into the fin structure 206d adjacent to the epitaxial layer 508e. The gate structure 212b is between epitaxial layer 508e and the epitaxial layer 508f.

The RO type of semiconductor device includes an insulator layer 304e (e.g., a first oxide layer) between a bottom surface 604c (e.g., a first bottom surface) of the epitaxial layer 508e and the fin structure 206d. The RO type of semiconductor device further includes another insulator layer 304f (e.g., a second oxide layer) between a bottom surface 604d (e.g., a second bottom surface) of the epitaxial layer 508f and the fin structure 206d.

At least one of the insulator layer 304e or the insulator layer 304f includes a thickness 606b and a width 608b. The thickness 606b may be in a range from approximately 1 nanometer to approximately 5 nanometers, and the width 608b may be in a range from approximately 10 nanometers to approximately 40 nanometers. For a thickness 606b and width 608b that are less than these ranges, leakage within a transistor of the RO type of semiconductor device increase. For a thickness 606b and a width 608b that are greater than these ranges, an activation voltage for the transistor of the RO type of semiconductor device may increase beyond operability. However, other values and ranges for the thickness 606b and the width 608b are within the scope of the present disclosure.

FIG. 6C shows an example 612 that corresponds to an IO type of semiconductor device (e.g., a type of the semiconductor device 200). The example 612 includes a fin structure 206e (e.g., the fin structure 206 extending above the semiconductor substrate 204), an epitaxial layer 508g (e.g., a first epitaxial layer) extending into the fin structure 206e, and another epitaxial layer 508h (e.g., a second epitaxial layer) extending into the fin structure 206e adjacent to the epitaxial layer 508g. The gate structure 212c is between epitaxial layer 508g and the epitaxial layer 508h.

The IO type of semiconductor device includes an insulator layer 304g (e.g., a first oxide layer or a first dielectric layer, among other examples) between a bottom surface 604e (e.g., a first bottom surface) of the epitaxial layer 508g and the fin structure 206e. The IO type of semiconductor device further includes another insulator layer 304h (e.g., a second oxide layer or a second dielectric layer, among other examples) between a bottom surface 604f (e.g., a second bottom surface) of the epitaxial layer 508h and the fin structure 206e.

At least one of the insulator layer 304g or the insulator layer 304h includes a thickness 606c and a width 608c. The thickness 606c may be in a range from approximately 1 nanometer to approximately 7 nanometers, and the width 608c may be in a range from approximately 20 nanometers to approximately 60 nanometers. For a thickness 606c and width 608c that are less than these ranges, leakage within a transistor of the RO type of semiconductor device may increase. For a thickness 606c and a width 608c that are greater than these ranges, an activation voltage for the transistor of the IO type of semiconductor device may increase beyond operability. However, other values and ranges for the thickness 606c and the width 608c are within the scope of the present disclosure.

The number and arrangement of devices shown in FIG. 6A-6C are provided as one or more examples. In practice, there may be additional devices, fewer devices, different devices, or differently arranged devices than those shown in FIGS. 6A-6C. Furthermore, two or more devices shown in FIGS. 6A-6C may be implemented within a single device, or a single device shown in FIGS. 6A-6C may be implemented as multiple, distributed devices.

Figure 7A:
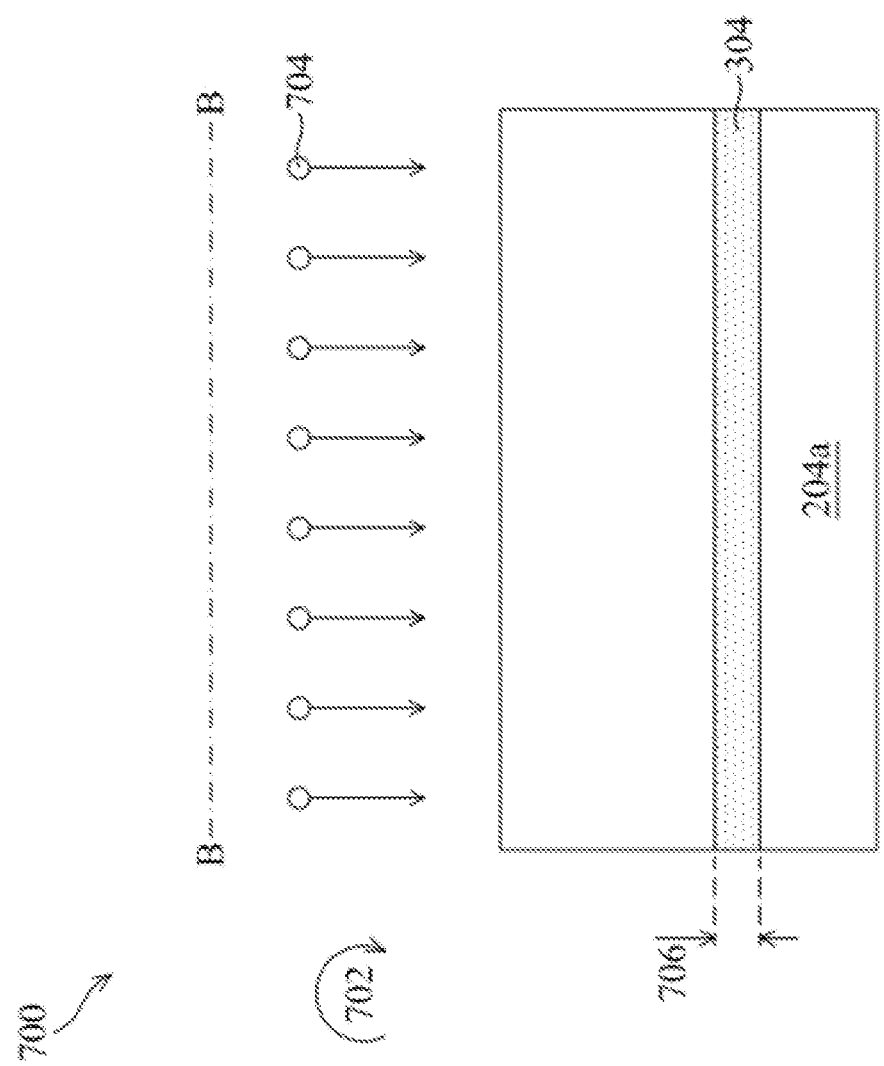
Figure 7C:
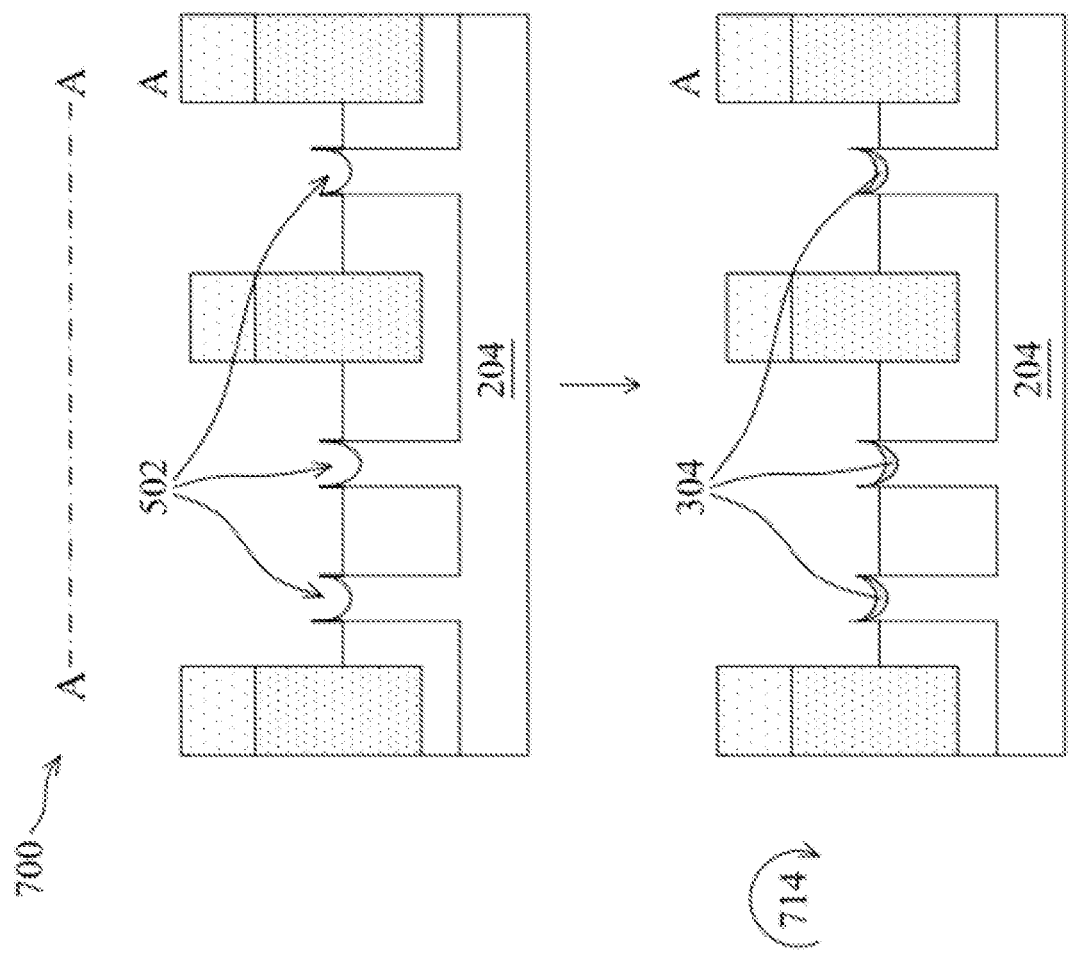

FIGS. 7A-7C are diagrams 700 of example processing operations to form the insulator layer 304 described herein (e.g., forming a dielectric layer including a layer of a silicon dioxide ($SiO_2$) material, among other examples). FIGS. 7A-7C are illustrated from the perspective of the cross-sectional plane B-B in FIG. 2 for the device region 202. The insulator layer 304 may be formed in or on the semiconductor substrate 204 prior to deposition of the epitaxial layer 508. In some implementations, the structure produced by the techniques described in FIGS. 7A-7C corresponds to a silicon-on-insulator (SOI) substrate.

FIG. 7A shows a method of forming the insulator layer 304. As shown, an ion-implantation processing operation 702 (e.g., an ion-implantation processing operation performed by the ion implantation tool 114) may include implanting ions 704 into the semiconductor substrate 204 to form the insulator layer 304. Implanting the ions may include implanting oxygen (O) ions, boron (B) ions, arsenic (As) ions, or phosphorous (P) ions, among other examples. In some implementations, one or more additional layers (e.g., a cover layer or a patterned masking layer, among other examples) may be over the semiconductor substrate 204 to create regions of the insulator layer 304 within the semiconductor substrate 204.

In some implementations, a thickness 706 of the insulator layer 304 may be in a range from approximately 5 nanometers to approximately 50 nanometers. For a thickness 706 that is greater than this range, subsequent processing operations for a selected type of the semiconductor device 200 (e.g., an SRAM type of semiconductor device, an RO type of semiconductor device, or an IO type of semiconductor device, among other examples) may not produce a transistor having a targeted activation voltage. For a thickness 706 that is less than this range, subsequent processing operations for the selected type of the semiconductor device 200 may not be able to produce a transistor with reduced leakage characteristics. However, other values and ranges for the thickness 706 are within the scope of the present disclosure.

FIG. 7B shows another method of forming the insulator layer 304. At processing operation 708 of FIG. 7B, the insulator layer 304 is formed on a portion of the semiconductor substrate 204a. Forming the insulator layer 304 at processing operation 708 may include, as an example, forming the insulator layer 304 using a thermal-oxidation processing operation or a CVD processing operation.

After formation of the insulator layer 304, and at processing operation 710, another portion of the semiconductor substrate 204b is formed. Processing operation 710 may include forming the portion of the semiconductor substrate 204b on the insulator layer 304 using an epitaxial-growth processing operation. The processing operation 710 may use a silicon containing gas such as a silane ($SiH_4$) gas and/or a germanium containing gas such as germane ($GeH_4$) gas, among other examples. Using such gases, the processing operation 710 (e.g., an epitaxial-growth processing operation) may epitaxially grow the portion of the semiconductor substrate 204b (e.g., an epitaxial layer) from a layer of an Si material or a layer of an SiGe material, among other examples.

FIG. 7C shows another method of forming the insulator layer 304. At processing operation 712 (e.g., after forming the recesses 502 as described in connection with FIG. 5B), portions of the insulator layer 304 may be formed through oxidation growth. The oxidation growth may include, for example, native growth of $SiO_2$ on bottom surfaces of the recesses 502, deposition of $SiO_2$ on bottom surfaces of the recesses 502, and/or another oxidation growth technique.

As described in FIGS. 7A-7C, and in connection with processing operations described in FIGS. 3A-3H, 4A-4D, and 5A-5F, a method that forms the semiconductor device 200 with the epitaxial region 512 over the insulator layer 304 may be performed. The method may include forming the insulator layer 304 (e.g., a dielectric layer) in or on the semiconductor substrate 204 and forming the fin structure 206 in the semiconductor substrate 204. In some implementations, the fin structure 206 includes a portion of the insulator layer 304. The method may further include forming the recess 502 in the fin structure 206 to the portion of the insulator layer 304 and forming the epitaxial region 512 over the portion of the insulator layer 304 in the recess 502.

As indicated above, FIGS. 7A-7C are provided as examples. Other examples may differ from what is described with regard to FIGS. 7A-7C. For example, different combinations of the processing operations described by FIGS. 7A-7C may be used to form a first insulator layer (e.g., the insulator layer 304a of FIGS. 5A-5F, among other examples) from a first material and to form a second insulator layer (e.g., the insulator layer 304b of FIGS. 5A-5F, among other examples) from a second material that is different than the first material. Additionally, or alternatively, different combinations of the processing operations described by FIGS. 7A-7C may be used to form a first insulator layer (e.g., the insulator layer 304c of FIG. 6A, among other examples) to a first thickness (e.g., the thickness 606a) and to form a second insulator layer (e.g., the insulator layer 304d of FIG. 6A, among other examples) to a second thickness (e.g., the thickness 606a) that is different than the first thickness.

Figure 8:
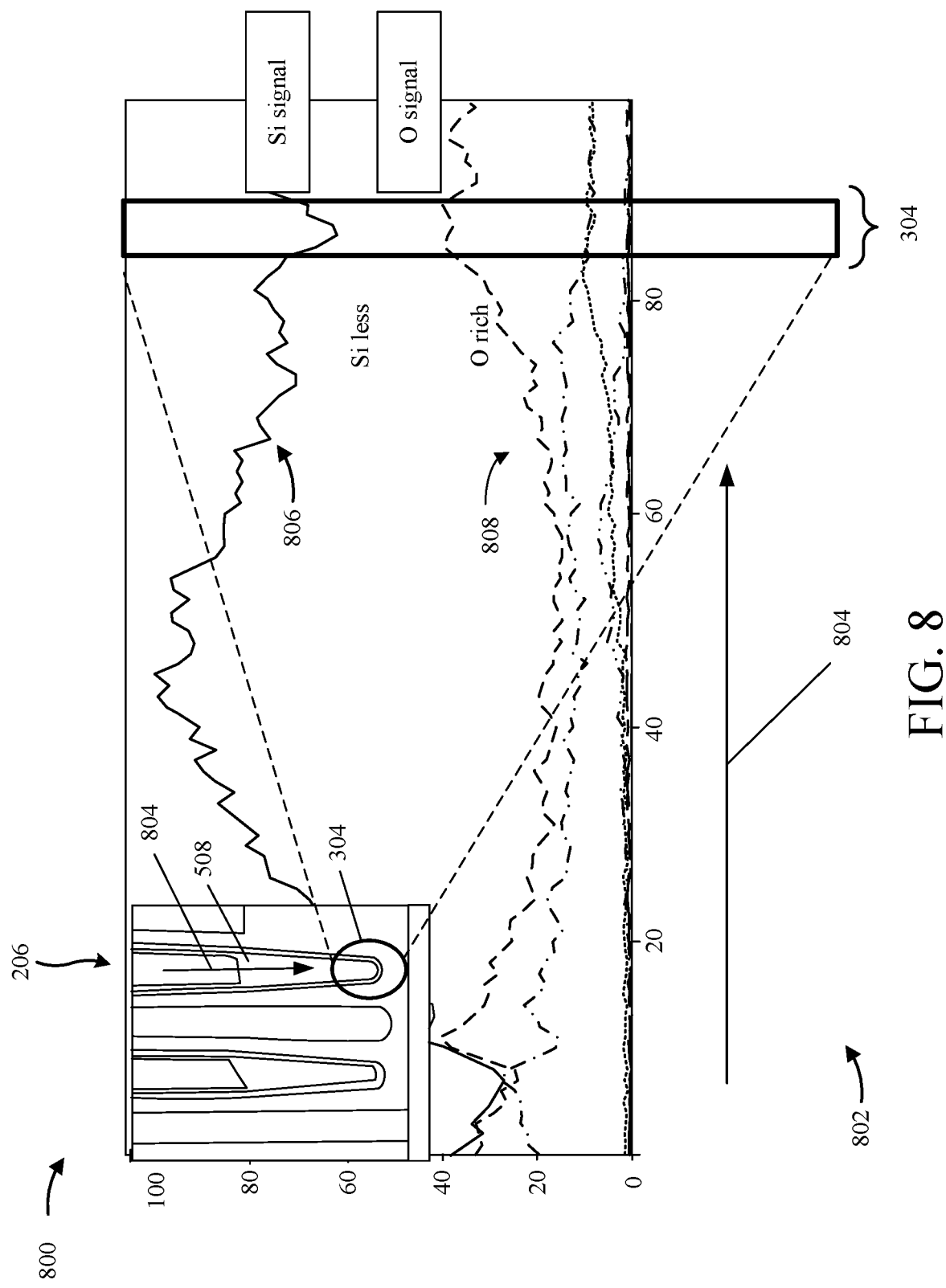
FIG. 8 is a diagram of an example elemental composition of portions of a semiconductor device described herein.

FIG. 8 is a diagram of an example elemental analysis 800 of portions of the semiconductor device 200 described herein. FIG. 8 illustrates an example vertical elemental analysis 802 of the fin structure 206 through a source/drain region including the epitaxial layer 508 and the insulator layer 304. The vertical elemental analysis 802, which may be performed using an energy dispersive x-ray (EDX) analysis technique, is along a vertical axis 804.

As shown in FIG. 8, a normalized absolute intensity of a signal 806 corresponding to an amount of silicon along a portion of the vertical axis 804 (e.g., a portion corresponding to the epitaxial layer 508) is in a range from approximately 80% to approximately 100%. Along the same portion, the normalized absolute intensity of a signal 808 corresponding to an amount of oxygen is in a range from approximately to approximately 20% and 30%.

As further shown in FIG. 8, the normalized absolute intensity of the signal 806 reduces to a range from approximately 60% to 70% along another portion of the vertical axis 804 (e.g., another portion corresponding to the insulator layer 304). The reduction of the normalized absolute intensity of the signal 806 in this other portion corresponds to a reduced presence of silicon.

Along the same other portion, the normalized absolute intensity of the signal 808 increases to a range from approximately 35% to approximately 45%. The increase in the normalized absolute intensity of the signal 808 in this other portion corresponds to an enriched presence of oxygen (e.g., oxygen included in $SiO_2$, among other examples).

As indicated above, FIG. 8 is provided as an example. Other examples may differ from what is described with regard to FIG. 8.

Figure 9:
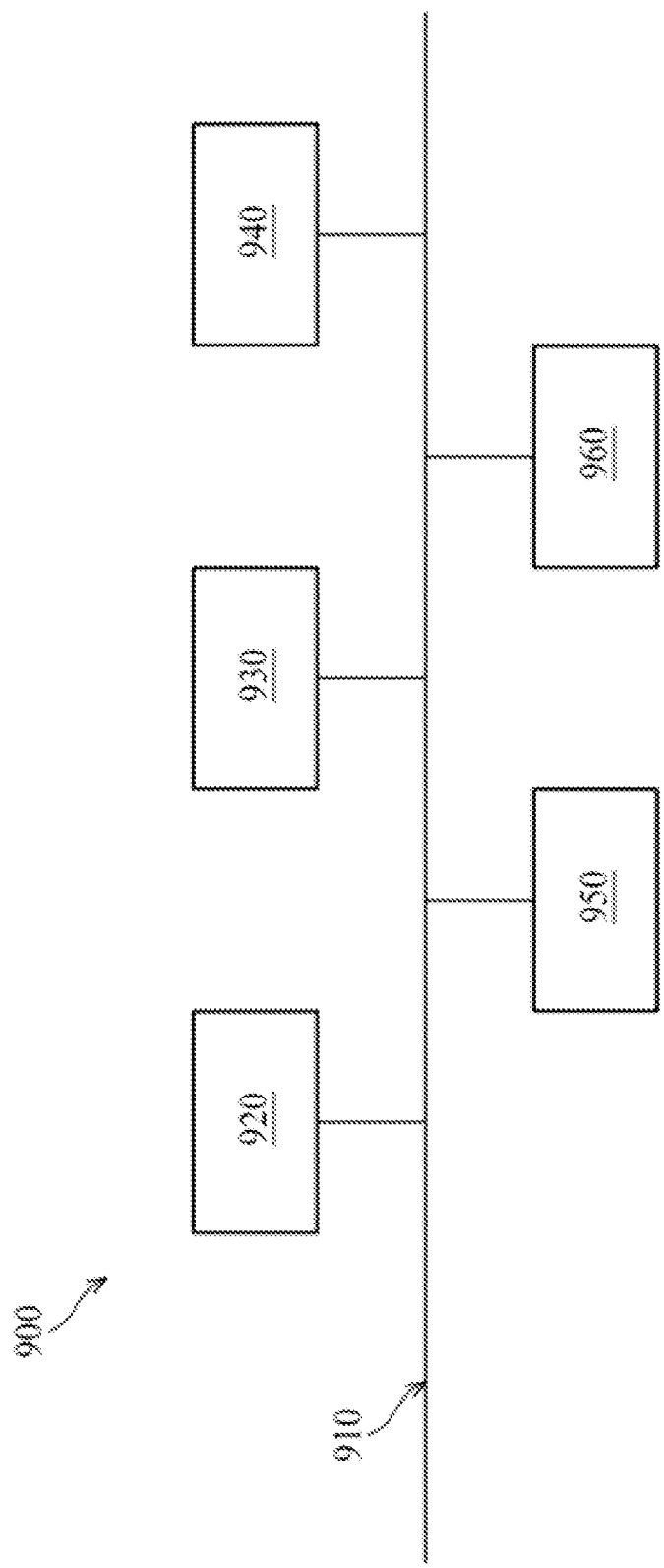
FIG. 9 is a diagram of example components of a device described herein.

FIG. 9 is a diagram of example components of a device 900 described herein. In some implementations, one or more of the semiconductor processing devices 102-114 and/or the wafer/die transport tool 116 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
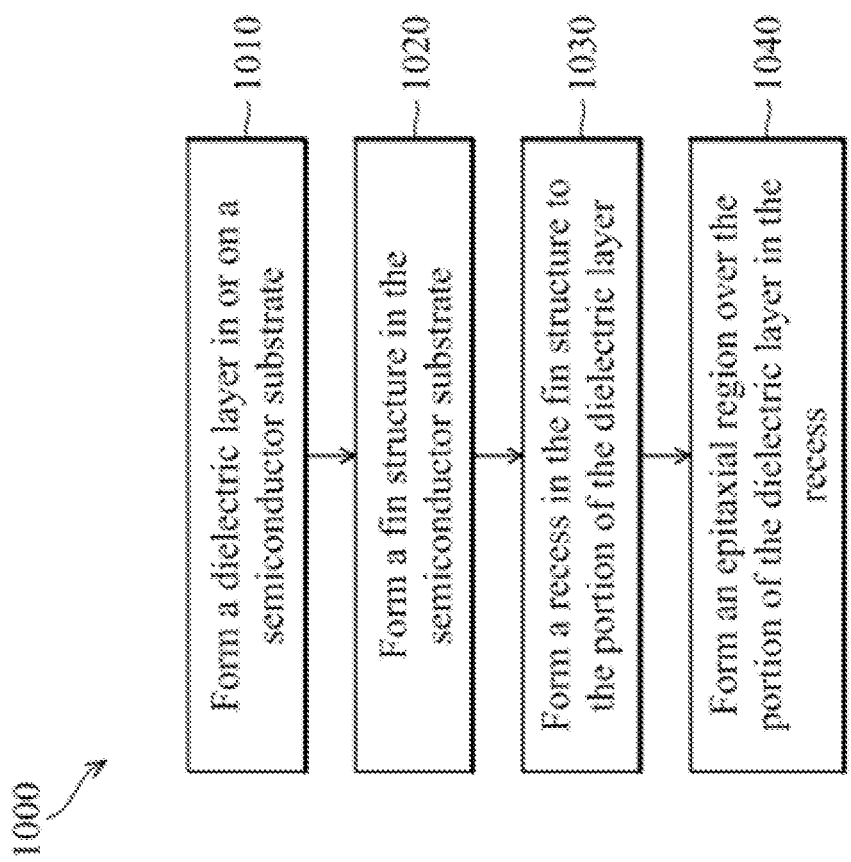
FIG. 10 is a flowchart of an example process associated with forming a semiconductor device described herein.

FIG. 10 is a flowchart of an example process 1000 associated with forming a semiconductor device described herein. In some implementations, one or more process blocks of FIG. 10 are performed by one or more semiconductor processing tools (e.g., one or more of the semiconductor processing tools 102-114). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming a dielectric layer in or on a semiconductor substrate (block 1010). For example, one or more of the processing tools 102-114 may form a dielectric layer (e.g., an insulator layer 304) in or on a semiconductor substrate 204, as described above.

As further shown in FIG. 10, process 1000 may include forming a fin structure in the semiconductor substrate (block 1020). For example, one or more of the semiconductor processing tools 102-114 may form a fin structure 206 in the semiconductor substrate 204. In some implementations, the fin structure 206 includes a portion of the dielectric layer.

As further shown in FIG. 10, process 1000 may include forming a recess in the fin structure to the portion of the dielectric layer (block 1030). For example, one or more of the semiconductor processing tools 102-114 may form a recess 502 in the fin structure 206 to the portion of the dielectric layer, as described above.

As further shown in FIG. 10, process 1000 may include forming an epitaxial region over the portion of the dielectric layer in the recess (block 1040). For example, one or more of the semiconductor processing tools 102-114 may form an epitaxial region 512 over the portion of the dielectric layer in the recess 502, as described above.

Process 1000 may include additional implementations, such as any single implementation or any combination of implementations described below and/or in connection with one or more other processes described elsewhere herein.

In a first implementation, forming the dielectric layer in or on the semiconductor substrate 204 includes forming the dielectric layer to a thickness 706 that is in a range from approximately 5 nanometers to approximately 50 nanometers.

In a second implementation, alone or in combination with the first implementation, forming the dielectric layer in or on the semiconductor substrate 204 includes forming a layer of silicon dioxide ($SiO_2$) material.

In a third implementation, alone or in combination with one or more of the first and second implementations, forming the dielectric layer in or on the semiconductor substrate 204 includes forming the dielectric layer below a surface of the semiconductor substrate 204 using an ion-implantation processing operation 702.

In a fourth implementation, alone or in combination with one or more of the first through third implementations, forming the recess 502 in the fin structure 206 includes forming the recess 502 into a portion of the dielectric layer.

In a fifth implementation, alone or in combination with one or more of the first through fourth implementations, forming the dielectric layer in or on the semiconductor substrate 204 includes forming the dielectric layer on a surface of the semiconductor substrate 204 using a thermal-oxidation processing operation 708.

In a sixth implementation, alone or in combination with one or more of the first through fifth implementations, process 1000 includes forming an epitaxial layer (e.g., a semiconductor substrate 204b) on a top surface of the dielectric layer using an epitaxial-growth processing operation 710 prior to forming the fin structure 206.

In a seventh implementation, alone or in combination with one or more of the first through sixth implementations, forming the fin structure 206 includes forming the fin structure 206 such that the fin structure 206 includes a portion of the epitaxial layer (e.g., a semiconductor substrate 204b).

In an eighth implementation, alone or in combination with one or more of the first through seventh implementations, forming the epitaxial region 512 includes forming a first epitaxial layer 508 on the dielectric layer and between fin sidewall spacers 504, forming a second epitaxial layer 510 on the first epitaxial layer 508 and above the fin sidewall spacers 504, and forming a third epitaxial layer 516 on the second epitaxial layer 510.

In a ninth implementation, alone or in combination with one or more of the first through eighth implementations, forming the second epitaxial layer 510 includes forming a merged-epitaxial sub-region 514 that joins the epitaxial region and another epitaxial region 512b on another fin structure 206b.

In a tenth implementation, alone or in combination with one or more of the first through ninth implementations, process 1000 includes forming a contact layer 520 over the third epitaxial layer 516.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Some implementations described herein provide techniques and apparatuses for forming insulator layers in or on a semiconductor substrate prior to forming epitaxial layers within source/drain regions of a finFET. The epitaxial layers may be formed over the insulator layers to reduce electron tunneling between the source/drain regions of the finFET.

In this way, a likelihood of leakage into the semiconductor substrate and/or between the source/drain regions of the finFET is reduced. As a result, performance characteristics relating to power consumption of a semiconductor device including the finFET and operation of a gate structure between the source/drain regions may be increased.

As described in greater detail above, some implementations described herein provide a semiconductor device. The semiconductor device includes a fin structure above a semiconductor substrate. The semiconductor device includes a first epitaxial region extending into the fin structure. The semiconductor device includes a second epitaxial region extending into the fin structure adjacent to the first epitaxial region. The semiconductor device includes a gate structure between the first epitaxial region and the second epitaxial region. The semiconductor device includes a first oxide layer between a first bottom surface of the first epitaxial region and the fin structure. The semiconductor device includes a second oxide layer between a second bottom surface of the second epitaxial region and the fin structure.

As described in greater detail above, some implementations described herein provide a method. The method includes forming a dielectric layer in or on a semiconductor substrate. The method includes forming a fin structure in the semiconductor substrate, where the fin structure includes a portion of the dielectric layer. The method includes forming a recess in the fin structure to the portion of the dielectric layer. The method includes forming an epitaxial region over the portion of the dielectric layer in the recess.

As described in greater detail above, some implementations described herein provide a semiconductor device. The semiconductor device includes a first fin structure above a semiconductor substrate. The semiconductor device includes a second fin structure above the semiconductor substrate and adjacent to the first fin structure. The semiconductor device includes a first epitaxial region extending into the first fin structure. The semiconductor device includes a second epitaxial region extending into the second fin structure. The semiconductor device includes a first insulator layer between the first fin structure and a bottom portion of the first epitaxial region. The semiconductor device includes a second insulator layer between the second fin structure and a bottom portion of the second epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer in or on a semiconductor substrate;
   forming a fin structure in the semiconductor substrate, wherein the fin structure includes a portion of the dielectric layer;
   forming a recess in the fin structure to an entire top surface of the portion of the dielectric layer, wherein a bottom of the recess exposes the entire top surface of the portion of the dielectric layer; and
   forming an epitaxial region over the entire top surface of the portion of the dielectric layer in the recess.

2. The method of claim 1, wherein forming the dielectric layer in or on the semiconductor substrate comprises:
   forming the dielectric layer to a thickness that is in a range from approximately 5 nanometers to approximately 50 nanometers.

3. The method of claim 1, wherein forming the dielectric layer in or on the semiconductor substrate comprises:
   forming a layer of silicon dioxide ($SiO_2$) material.

4. The method of claim 1, wherein forming the dielectric layer in or on the semiconductor substrate comprises:
   forming the dielectric layer below a surface of the semiconductor substrate using an ion-implantation processing operation.

5. The method of claim 1, wherein forming the dielectric layer in or on the semiconductor substrate comprises:
   forming the dielectric layer on a surface of the semiconductor substrate using a thermal-oxidation processing operation.

6. The method of claim 1, further comprising:
   forming an epitaxial layer on a top surface of the dielectric layer using an epitaxial-growth processing operation prior to forming the fin structure.

7. The method of claim 6, wherein forming the fin structure comprises:
   forming the fin structure such that the fin structure includes a portion of the epitaxial layer.

8. The method of claim 1, wherein forming the epitaxial region comprises:
   forming a first epitaxial layer on the dielectric layer and between fin sidewall spacers;
   forming a second epitaxial layer on the first epitaxial layer and above the fin sidewall spacers; and
   forming a third epitaxial layer on the second epitaxial layer.

9. The method of claim 8, wherein forming the second epitaxial layer comprises:
   forming a merged-epitaxial sub-region that joins the epitaxial region and another epitaxial region on another fin structure.

10. The method of claim 8, further comprising:
    forming a contact layer over the third epitaxial layer.

11. A method, comprising:
    forming one or more fin structures extending from a substrate and between hybrid fin structures,
       wherein the one or more fin structures reside above an insulator layer that resides in the substrate;
    forming one or more recesses in the one or more fin structures to one or more portions of the insulator layer; and
    forming one or more epitaxial regions in the one or more recesses and over an entire top surface of the one or more portions of the insulator layer.

12. The method of claim 11, further comprising:
    forming sidewall spacers on the one or more fin structures,
       wherein the one or more recesses are further formed in the sidewall spacers.

13. The method of claim 12, further comprising:
    forming one or more epitaxial layers within the one or more fin structures,
       wherein a top surface of the one or more epitaxial layers is below a top surface of the one or more fin structures, and
       wherein the one or more epitaxial regions are formed over the one or more epitaxial layers.

14. The method of claim 11, wherein after the one or more recesses are formed, a top surface of the one or more recesses is rounded or concave.

15. The method of claim 11, wherein forming the one or more epitaxial regions comprises:
    forming a first epitaxial layer on the insulator layer, and
    forming a second epitaxial layer on the first epitaxial layer.

16. The method of claim 15, wherein:
    the first epitaxial layer is formed within side spacers of the one or more fin structures, and
    the second epitaxial layer is formed above the side spacers.

17. The method of claim 15, wherein the second epitaxial layer is more heavily doped than the first epitaxial layer.

18. A method, comprising:
    forming a plurality of fin structures extending from a substrate and between a plurality of hybrid fin structures,
       wherein the plurality of fin structures resides above an insulator layer that resides in the substrate;
    forming a first recess, in a first fin structure of the plurality of fin structures to an entire top surface of a first portion of the insulator layer, and a second recess, in a second fin structure of the plurality of fin structures to an entire top surface of a second portion of the insulator layer, wherein a bottom of the first recess exposes the entire top surface of the first portion of the insulator layer, and wherein a bottom of the second recess exposes the entire top surface of the second portion of the insulator layer; and forming a merged-epitaxial sub-region that joins a first epitaxial region, over the first recess, and a second epitaxial region, over the second recess.

19. The method of claim 18, further comprising:

forming an epitaxial layer over the first epitaxial region, the second epitaxial region, and the merged-epitaxial sub-region.

20. The method of claim 18, further comprising at least one of:

forming an inner-layer dielectric (ILD) layer over the plurality of hybrid fin structures, or forming a contact layer, comprising titanium, over a top surface of the first epitaxial region, the second epitaxial region, and the merged-epitaxial sub-region.

* * * * *